(12) United States Patent
Liu et al.

(10) Patent No.: US 11,004,881 B2
(45) Date of Patent: May 11, 2021

(54) GLOBAL SHUTTER IMAGE SENSOR

(71) Applicant: Facebook Technologies, LLC, Menlo Park, CA (US)

(72) Inventors: Xinqiao Liu, Medina, WA (US); Song Chen, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/369,763

(22) Filed: Mar. 29, 2019

(65) Prior Publication Data

US 2019/0305020 A1    Oct. 3, 2019

Related U.S. Application Data

(60) Provisional application No. 62/652,220, filed on Apr. 3, 2018.

(51) Int. Cl.
*H01L 27/146* (2006.01)
*H04N 5/3745* (2011.01)
*H04N 5/355* (2011.01)

(52) U.S. Cl.
CPC .... *H01L 27/14605* (2013.01); *H01L 27/1461* (2013.01); *H04N 5/3559* (2013.01); *H04N 5/37452* (2013.01)

(58) Field of Classification Search
CPC .......... H01L 27/14605; H01L 27/1461; H01L 27/146–14893; H01L 27/14643–14663;
(Continued)

(56) References Cited

U.S. PATENT DOCUMENTS 4,596,977 A   6/1986  Bauman et al.
5,053,771 A   10/1991 McDermott
(Continued)

FOREIGN PATENT DOCUMENTS

DE    202016105510   10/2016
EP         0675345    10/1995
(Continued)

OTHER PUBLICATIONS

Cho et al., A Low Power Dual CDS for a Column-Parallel CMOS Image Sensor, Journal of Semiconductor Technology and Science, vol. 12, No. 4, Dec. 30, 2012, pp. 388-396.
(Continued)

*Primary Examiner* — Shahed Ahmed
(74) *Attorney, Agent, or Firm* — Kilpatrick Townsend & Stockton

(57) ABSTRACT

Examples of image sensors are provided. In one example, a pixel cell comprises a first semiconductor die, a sampling capacitor, and a second semiconductor die which may include the sampling capacitor. The first semiconductor die includes a photodiode and a charge sensing device. The second semiconductor die forms a stack with the first semiconductor die, the second semiconductor die including an interface circuit coupled with the photodiode, the charge sensing device, and the sampling capacitor. The interface circuit is configured to: enable the photodiode to accumulate charge responsive to incident light within a integration period; transfer the charge from the photodiode to the charge sensing device; perform, using the sampling capacitor, a sample-and-hold operation to convert the charge in the charge sensing device into a voltage; and generate a digital output based on the voltage to represent an intensity of the incident light received by the photodiode.

20 Claims, 18 Drawing Sheets

(58) Field of Classification Search
CPC ........ H01L 27/14689; H01L 27/14603; H04N 5/3559; H04N 5/37452; H04N 5/379; H04N 5/37455

See application file for complete search history.

(56) References Cited

U.S. PATENT DOCUMENTS

| | | | |
|---|---|---|---|
| 5,844,512 | A | 12/1998 | Gorin et al. |
| 6,522,395 | B1* | 2/2003 | Bamji .................... G01S 7/486 356/5.01 |
| 6,529,241 | B1 | 3/2003 | Clark |
| 6,864,817 | B1 | 3/2005 | Salvi et al. |
| 7,659,772 | B2 | 2/2010 | Nomura et al. |
| 7,719,589 | B2 | 5/2010 | Turchetta et al. |
| 8,134,623 | B2 | 3/2012 | Purcell et al. |
| 8,144,227 | B2 | 3/2012 | Kobayashi |
| 8,369,458 | B2 | 2/2013 | Wong et al. |
| 8,426,793 | B1 | 4/2013 | Barrows |
| 8,754,798 | B2 | 6/2014 | Lin |
| 8,773,562 | B1 | 7/2014 | Fan |
| 8,779,346 | B2 | 7/2014 | Fowler et al. |
| 8,946,610 | B2 | 2/2015 | Iwabuchi et al. |
| 9,094,629 | B2 | 7/2015 | Ishibashi |
| 9,185,273 | B2 | 11/2015 | Beck et al. |
| 9,274,151 | B2 | 3/2016 | Lee et al. |
| 9,332,200 | B1 | 5/2016 | Hseih et al. |
| 9,343,497 | B2 | 5/2016 | Cho |
| 9,363,454 | B2 | 6/2016 | Ito et al. |
| 9,478,579 | B2 | 10/2016 | Dai et al. |
| 9,497,396 | B2 | 11/2016 | Choi |
| 9,531,990 | B1 | 12/2016 | Wilkins et al. |
| 9,800,260 | B1 | 10/2017 | Banerjee |
| 9,819,885 | B2 | 11/2017 | Furukawa et al. |
| 9,909,922 | B2 | 3/2018 | Schweickert et al. |
| 9,948,316 | B1 | 4/2018 | Yun et al. |
| 9,967,496 | B2 | 5/2018 | Ayers et al. |
| 10,003,759 | B2 | 6/2018 | Fan |
| 10,015,416 | B2 | 7/2018 | Borthakur et al. |
| 10,419,701 | B2 | 9/2019 | Liu |
| 10,574,925 | B2 | 2/2020 | Otaka |
| 10,598,546 | B2 | 3/2020 | Liu |
| 10,608,101 | B2 | 3/2020 | Liu |
| 10,686,996 | B2 | 6/2020 | Liu |
| 10,804,926 | B2 | 10/2020 | Gao et al. |
| 10,812,742 | B2 | 10/2020 | Chen et al. |
| 2002/0067303 | A1 | 6/2002 | Lee et al. |
| 2003/0020100 | A1 | 1/2003 | Guidash |
| 2003/0049925 | A1 | 3/2003 | Layman et al. |
| 2004/0095495 | A1 | 5/2004 | Inokuma et al. |
| 2004/0251483 | A1 | 12/2004 | Ko et al. |
| 2005/0057389 | A1 | 3/2005 | Krymski |
| 2005/0104983 | A1 | 5/2005 | Raynor |
| 2005/0280727 | A1 | 12/2005 | Sato et al. |
| 2006/0023109 | A1 | 2/2006 | Mabuchi et al. |
| 2006/0158541 | A1 | 7/2006 | Ichikawa |
| 2007/0013983 | A1 | 1/2007 | Kitamura et al. |
| 2007/0076481 | A1 | 4/2007 | Tennant |
| 2007/0092244 | A1 | 4/2007 | Pertsel et al. |
| 2007/0102740 | A1 | 5/2007 | Ellis-Monaghan et al. |
| 2007/0131991 | A1 | 6/2007 | Sugawa |
| 2007/0208526 | A1 | 9/2007 | Staudt et al. |
| 2007/0222881 | A1 | 9/2007 | Mentzer |
| 2008/0001065 | A1 | 1/2008 | Ackland |
| 2008/0068478 | A1 | 3/2008 | Watanabe |
| 2008/0088014 | A1 | 4/2008 | Adkisson et al. |
| 2008/0191791 | A1 | 8/2008 | Nomura et al. |
| 2008/0226183 | A1 | 9/2008 | Lei et al. |
| 2009/0002528 | A1 | 1/2009 | Manabe et al. |
| 2009/0091645 | A1 | 4/2009 | Trimeche et al. |
| 2009/0128640 | A1 | 5/2009 | Yumiki |
| 2009/0224139 | A1 | 9/2009 | Buettgen et al. |
| 2009/0261235 | A1 | 10/2009 | Lahav et al. |
| 2010/0013969 | A1 | 1/2010 | Ui |
| 2010/0140732 | A1 | 6/2010 | Eminoglu et al. |
| 2010/0276572 | A1 | 11/2010 | Iwabuchi et al. |
| 2011/0049589 | A1 | 3/2011 | Chuang et al. |
| 2011/0149116 | A1 | 6/2011 | Kim |
| 2011/0254986 | A1 | 10/2011 | Nishimura et al. |
| 2012/0039548 | A1 | 2/2012 | Wang et al. |
| 2012/0068051 | A1 | 3/2012 | Ahn et al. |
| 2012/0092677 | A1 | 4/2012 | Suehira et al. |
| 2012/0127284 | A1 | 5/2012 | Bar-Zeev et al. |
| 2012/0133807 | A1 | 5/2012 | Wu et al. |
| 2012/0138775 | A1 | 6/2012 | Cheon et al. |
| 2012/0153123 | A1* | 6/2012 | Mao .................... H04N 5/37452 250/208.1 |
| 2012/0188420 | A1 | 7/2012 | Black et al. |
| 2012/0241591 | A1 | 9/2012 | Wan et al. |
| 2012/0262616 | A1 | 10/2012 | Sa et al. |
| 2012/0267511 | A1 | 10/2012 | Kozlowski |
| 2012/0273654 | A1 | 11/2012 | Hynecek et al. |
| 2013/0020466 | A1 | 1/2013 | Ayers et al. |
| 2013/0056809 | A1 | 3/2013 | Mao et al. |
| 2013/0057742 | A1 | 3/2013 | Nakamura et al. |
| 2013/0082313 | A1 | 4/2013 | Manabe |
| 2013/0113969 | A1 | 5/2013 | Manabe et al. |
| 2013/0126710 | A1 | 5/2013 | Kondo |
| 2013/0141619 | A1 | 6/2013 | Lim et al. |
| 2013/0207219 | A1 | 8/2013 | Ahn |
| 2013/0214371 | A1 | 8/2013 | Asatsuma et al. |
| 2013/0229543 | A1 | 9/2013 | Hashimoto et al. |
| 2013/0229560 | A1 | 9/2013 | Kondo |
| 2013/0234029 | A1 | 9/2013 | Bikumandla |
| 2013/0293752 | A1 | 11/2013 | Peng et al. |
| 2013/0299674 | A1 | 11/2013 | Fowler et al. |
| 2014/0021574 | A1 | 1/2014 | Egawa |
| 2014/0042299 | A1 | 2/2014 | Wan et al. |
| 2014/0042582 | A1 | 2/2014 | Kondo |
| 2014/0085523 | A1 | 3/2014 | Hynecek |
| 2014/0176770 | A1 | 6/2014 | Kondo |
| 2014/0211052 | A1 | 7/2014 | Choi |
| 2014/0232890 | A1 | 8/2014 | Yoo et al. |
| 2014/0306276 | A1 | 10/2014 | Yamaguchi |
| 2015/0083895 | A1 | 3/2015 | Hashimoto et al. |
| 2015/0090863 | A1 | 4/2015 | Mansoorian et al. |
| 2015/0172574 | A1 | 6/2015 | Honda et al. |
| 2015/0189209 | A1 | 7/2015 | Yang et al. |
| 2015/0208009 | A1 | 7/2015 | Oh et al. |
| 2015/0229859 | A1 | 8/2015 | Guidash et al. |
| 2015/0237274 | A1 | 8/2015 | Yang et al. |
| 2015/0279884 | A1 | 10/2015 | Kusumoto |
| 2015/0287766 | A1 | 10/2015 | Kim et al. |
| 2015/0312502 | A1 | 10/2015 | Borremans |
| 2015/0350582 | A1 | 12/2015 | Korobov et al. |
| 2015/0358569 | A1 | 12/2015 | Egawa |
| 2015/0358593 | A1 | 12/2015 | Sato |
| 2015/0381907 | A1 | 12/2015 | Boettiger et al. |
| 2016/0028974 | A1 | 1/2016 | Guidash et al. |
| 2016/0028980 | A1 | 1/2016 | Kameyama et al. |
| 2016/0037111 | A1 | 2/2016 | Dai et al. |
| 2016/0088253 | A1 | 3/2016 | Tezuka |
| 2016/0100115 | A1 | 4/2016 | Kusano |
| 2016/0111457 | A1 | 4/2016 | Sekine |
| 2016/0112626 | A1 | 4/2016 | Shimada |
| 2016/0118992 | A1 | 4/2016 | Milkov |
| 2016/0165160 | A1* | 6/2016 | Hseih .................... H04N 5/3765 348/308 |
| 2016/0204150 | A1 | 7/2016 | Oh et al. |
| 2016/0240570 | A1 | 8/2016 | Barna et al. |
| 2016/0249004 | A1 | 8/2016 | Saeki et al. |
| 2016/0307945 | A1 | 10/2016 | Madurawe |
| 2016/0337605 | A1 | 11/2016 | Ito |
| 2016/0353045 | A1 | 12/2016 | Kawahito et al. |
| 2016/0360127 | A1 | 12/2016 | Dierickx et al. |
| 2017/0013215 | A1 | 1/2017 | McCarten |
| 2017/0053962 | A1 | 2/2017 | Oh et al. |
| 2017/0062501 | A1 | 3/2017 | Velichko et al. |
| 2017/0069363 | A1 | 3/2017 | Baker |
| 2017/0099446 | A1 | 4/2017 | Cremers et al. |
| 2017/0104021 | A1 | 4/2017 | Park et al. |
| 2017/0104946 | A1 | 4/2017 | Hong |
| 2017/0111600 | A1 | 4/2017 | Wang et al. |
| 2017/0141147 | A1 | 5/2017 | Raynor |
| 2017/0170223 | A1 | 6/2017 | Hynecek et al. |

(56) References Cited

U.S. PATENT DOCUMENTS

| | | | |
|---|---|---|---|
| 2017/0207268 A1 | 7/2017 | Kurokawa | |
| 2017/0346579 A1 | 11/2017 | Barghi | |
| 2017/0359497 A1* | 12/2017 | Mandelli | H04N 5/2353 |
| 2017/0366766 A1 | 12/2017 | Geurts et al. | |
| 2018/0019269 A1 | 1/2018 | Klipstein | |
| 2018/0077368 A1 | 3/2018 | Suzuki | |
| 2018/0152650 A1 | 5/2018 | Sakakibara et al. | |
| 2018/0220093 A1 | 8/2018 | Murao et al. | |
| 2018/0376046 A1 | 12/2018 | Liu | |
| 2019/0052788 A1 | 2/2019 | Liu | |
| 2019/0056264 A1 | 2/2019 | Liu | |
| 2019/0057995 A1 | 2/2019 | Liu | |
| 2019/0058058 A1 | 2/2019 | Liu | |
| 2019/0104263 A1 | 4/2019 | Ochiai et al. | |
| 2019/0104265 A1 | 4/2019 | Totsuka et al. | |
| 2019/0157330 A1 | 5/2019 | Sato et al. | |
| 2019/0172868 A1 | 6/2019 | Chen et al. | |
| 2019/0335151 A1 | 10/2019 | Rivard et al. | |
| 2019/0348460 A1 | 11/2019 | Chen et al. | |
| 2019/0355782 A1 | 11/2019 | Do et al. | |
| 2019/0379827 A1 | 12/2019 | Berkovich et al. | |
| 2020/0007800 A1 | 1/2020 | Berkovich et al. | |
| 2020/0068189 A1 | 2/2020 | Chen et al. | |

FOREIGN PATENT DOCUMENTS

| | | | |
|---|---|---|---|
| EP | 1681856 | | 7/2006 |
| EP | 1732134 | | 12/2006 |
| EP | 1746820 | | 1/2007 |
| EP | 2063630 | | 5/2009 |
| EP | 2538664 | | 12/2012 |
| EP | 2833619 | | 2/2015 |
| EP | 3032822 | A1 | 6/2016 |
| EP | 3258683 | | 12/2017 |
| EP | 3425352 | | 1/2019 |
| KR | 100574959 | | 4/2006 |
| KR | 20110050351 | | 5/2011 |
| KR | 20150095841 | | 8/2015 |
| KR | 20160008287 | | 1/2016 |
| WO | 2017058488 | | 4/2017 |
| WO | 2017069706 | | 4/2017 |
| WO | 2017169882 | | 10/2017 |
| WO | 2019168929 | | 9/2019 |

OTHER PUBLICATIONS

International Application No. PCT/US2019/025170, International Search Report and Written Opinion dated Jul. 9, 2019, 11 pages.
Tanner et al., Low-power Digital Image Sensor for Still Picture Image Acquisition, Visual Communications and Image Processing, vol. 4306, XP008014232, Jan. 22, 2001, pp. 358-365.
U.S. Appl. No. 15/668,241 , "Advisory Action", dated Oct. 23, 2019, 5 pages.
U.S. Appl. No. 15/668,241 , "Final Office Action", dated Jun. 17, 2019, 19 pages.
U.S. Appl. No. 15/668,241 , "Non-Final Office Action", dated Dec. 21, 2018, 3 pages.
U.S. Appl. No. 15/668,241 , "Notice of Allowance", dated Jun. 29, 2020, 8 pages.
U.S. Appl. No. 15/668,241 , "Notice of Allowance", dated Mar. 5, 2020, 8 pages.
U.S. Appl. No. 15/668,241 , "Supplemental Notice of Allowability", dated Apr. 29, 2020, 5 pages.
U.S. Appl. No. 15/719,345 , "Final Office Action", dated Apr. 29, 2020, 14 pages.
U.S. Appl. No. 15/719,345 , "Non-Final Office Action", dated Nov. 25, 2019, 14 pages.
U.S. Appl. No. 15/719,345 , "Notice of Allowance", dated Aug. 12, 2020, 11 pages.
U.S. Appl. No. 15/801,216 , "Advisory Action", dated Apr. 7, 2020, 3 pages.
U.S. Appl. No. 15/801,216 , "Final Office Action", dated Dec. 26, 2019, 5 pages.
U.S. Appl. No. 15/801,216 , "Non-Final Office Action", dated Jun. 27, 2019, 13 pages.
U.S. Appl. No. 15/801,216 , "Notice of Allowance", dated Jun. 23, 2020, 5 pages.
U.S. Appl. No. 15/847,517 , "Non-Final Office Action", dated Nov. 23, 2018, 21 pages.
U.S. Appl. No. 15/847,517 , "Notice of Allowance", dated May 1, 2019, 11 pages.
U.S. Appl. No. 15/861,588 , "Non-Final Office Action", dated Jul. 10, 2019, 11 pages.
U.S. Appl. No. 15/861,588 , "Notice of Allowance", dated Nov. 26, 2019, 9 pages.
U.S. Appl. No. 15/876,061 , "Corrected Notice of Allowability", dated Apr. 28, 2020, 3 pages.
U.S. Appl. No. 15/876,061 , "Non-Final Office Action", dated Sep. 18, 2019, 23 pages.
U.S. Appl. No. 15/876,061 , "Notice of Allowability", dated May 6, 2020, 2 pages.
U.S. Appl. No. 15/876,061 , "Notice of Allowance", dated Feb. 4, 2020, 13 pages.
U.S. Appl. No. 15/927,896 , "Non-Final Office Action", dated May 1, 2019, 10 pages.
U.S. Appl. No. 15/983,379 , "Notice of Allowance", dated Oct. 18, 2019, 9 pages.
U.S. Appl. No. 15/983,391 , "Non-Final Office Action", dated Aug. 29, 2019, 12 pages.
U.S. Appl. No. 15/983,391 , "Notice of Allowance", dated Apr. 8, 2020, 8 pages.
U.S. Appl. No. 16/177,971 , "Final Office Action", dated Feb. 27, 2020, 9 pages.
U.S. Appl. No. 16/177,971 , "Non-Final Office Action", dated Sep. 25, 2019, 9 pages.
U.S. Appl. No. 16/177,971 , "Notice of Allowance", dated Apr. 24, 2020, 6 pages.
U.S. Appl. No. 16/210,748 , "Final Office Action", dated Jul. 7, 2020, 11 pages.
U.S. Appl. No. 16/210,748 , "Non-Final Office Action", dated Jan. 31, 2020, 11 pages.
U.S. Appl. No. 16/249,420 , "Non-Final Office Action", dated Jul. 22, 2020, 9 pages.
U.S. Appl. No. 16/286,355 , "Non-Final Office Action", dated Oct. 1, 2019, 6 pages.
U.S. Appl. No. 16/286,355 , "Notice of Allowance", dated Feb. 12, 2020, 7 pages.
U.S. Appl. No. 16/286,355 , "Notice of Allowance", dated Jun. 4, 2020, 7 pages.
U.S. Appl. No. 16/382,015 , "Notice of Allowance", dated Jun. 11, 2020, 11 pages.
U.S. Appl. No. 16/384,720 , "Non-Final Office Action", dated May 1, 2020, 6 pages.
U.S. Appl. No. 16/431,693 , "Non-Final Office Action", dated Jan. 30, 2020, 6 pages.
U.S. Appl. No. 16/431,693 , "Notice of Allowance", dated Jun. 24, 2020, 7 pages.
U.S. Appl. No. 16/435,449 , "Notice of Allowance", dated Jul. 27, 2020, 8 pages.
U.S. Appl. No. 16/436,049 , "Non-Final Office Action", dated Jun. 30, 2020, 11 pages.
U.S. Appl. No. 16/436,049 , "Non-Final Office Action", dated Mar. 4, 2020, 9 pages.
U.S. Appl. No. 16/454,787 , "Notice of Allowance", dated Apr. 22, 2020, 10 pages.
U.S. Appl. No. 16/454,787 , "Notice of Allowance", dated Jul. 9, 2020, 9 pages.
U.S. Appl. No. 16/566,583 , "Final Office Action", dated Apr. 15, 2020, 24 pages.
U.S. Appl. No. 16/566,583 , "Non-Final Office Action", dated Oct. 1, 2019, 10 pages.
U.S. Appl. No. 16/566,583 , "Non-Final Office Action", dated Jul. 27, 2020, 11 pages.

(56) References Cited

OTHER PUBLICATIONS

EP18179838.0, "Extended European Search Report", dated May 24, 2019, 17 pages.
EP18179838.0, "Partial European Search Report", dated Dec. 5, 2018, 14 pages.
EP18179846.3, "Extended European Search Report", dated Dec. 7, 2018, 10 pages.
EP18179851.3, "Extended European Search Report", dated Dec. 7, 2018, 8 pages.
EP18188684.7, "Extended European Search Report", dated Jan. 16, 2019, 10 pages.
EP18188684.7, "Office Action", dated Nov. 26, 2019, 9 pages.
EP18188962.7, "Extended European Search Report", dated Oct. 23, 2018, 8 pages.
EP18188962.7, "Office Action", dated Aug. 28, 2019, 6 pages.
EP18188968.4, "Extended European Search Report", dated Oct. 23, 2018, 8 pages.
EP18188968.4, "Office Action", dated Aug. 14, 2019, 5 pages.
EP18189100.3, "Extended European Search Report", dated Oct. 9, 2018, 8 pages.
Kavusi et al., "Quantitative Study of High-Dynamic-Range Image Sensor Architectures", Proceedings of Society of Photo-Optical Instrumentation Engineers—The International Society for Optical Engineering, vol. 5301, Jun. 2004, pp. 264-275.
PCT/US2018/039350, "International Preliminary Report on Patentability", dated Jan. 9, 2020, 10 pages.
PCT/US2018/039350, "International Search Report and Written Opinion", dated Nov. 15, 2018, 13 pages.
PCT/US2018/039352, "International Search Report and Written Opinion", dated Oct. 26, 2018, 10 pages.
PCT/US2018/039431, "International Search Report and Written Opinion", dated Nov. 7, 2018, 14 pages.
PCT/US2018/045661, "International Search Report and Written Opinion", dated Nov. 30, 2018, 11 Pages.
PCT/US2018/045666, "International Preliminary Report on Patentability", dated Feb. 27, 2020, 11 pages.
PCT/US2018/045666, "International Search Report and Written Opinion", dated Dec. 3, 2018, 13 pages.
PCT/US2018/045673, "International Search Report and Written Opinion", dated Dec. 4, 2018, 13 pages.
PCT/US2018/046131, "International Search Report and Written Opinion", dated Dec. 3, 2018, 10 pages.
PCT/US2018/064181, "International Preliminary Report on Patentability", dated Jun. 18, 2020, 9 pages.
PCT/US2018/064181, "International Search Report and Written Opinion", dated Mar. 29, 2019, 12 pages.
PCT/US2019/014044, "International Search Report and Written Opinion", dated May 8, 2019, 11 pages.
PCT/US2019/019756, "International Search Report and Written Opinion", dated Jun. 13, 2019, 11 pages.
PCT/US2019/027727, "International Search Report and Written Opinion", dated Jun. 27, 2019, 11 pages.
PCT/US2019/027729, "International Search Report and Written Opinion", dated Jun. 27, 2019, 10 pages.
PCT/US2019/031521, "International Search Report and Written Opinion", dated Jul. 11, 2019, 11 pages.
PCT/US2019/035724, "International Search Report and Written Opinion", dated Sep. 10, 2019, 12 pages.
PCT/US2019/036484, "International Search Report and Written Opinion", dated Sep. 19, 2019, 10 pages.
PCT/US2019/036492, "International Search Report and Written Opinion", dated Sep. 25, 2019, 9 pages.
PCT/US2019/036536, "International Search Report and Written Opinion", dated Sep. 26, 2019, 14 pages.
PCT/US2019/036575, "International Search Report and Written Opinion", dated Sep. 30, 2019, 16 pages.
PCT/US2019/039410, "International Search Report and Written Opinion", dated Sep. 30, 2019, 11 pages.
PCT/US2019/039758, "International Search Report and Written Opinion", dated Oct. 11, 2019, 13 pages.
PCT/US2019/047156, "International Search Report and Written Opinion", dated Oct. 23, 2019, 9 pages.
PCT/US2019/048241, "International Search Report and Written Opinion", dated Jan. 28, 2020, 16 pages.
PCT/US2019/049756, "International Search Report and Written Opinion", dated Dec. 16, 2019, 8 pages.
PCT/US2019/059754, "International Search Report and Written Opinion", dated Mar. 24, 2020, 15 pages.
PCT/US2019/065430, "International Search Report and Written Opinion", dated Mar. 6, 2020, 15 pages.
Snoeij, "A Low Power Column-Parallel 12-Bit ADC for CMOS Imagers", Institute of Electrical and Electronics Engineers Workshop on Charge-Coupled Devices and Advanced Image Sensors, Jun. 2005, pp. 169-172.
Xu et al., "A New Digital-Pixel Architecture for CMOS Image Sensor with Pixel-Level ADC and Pulse Width Modulation using a 0.18 Mu M CMOS Technology", Institute of Electrical and Electronics Engineers Conference on Electron Devices and Solid-State Circuits, Dec. 16-18, 2003, pp. 265-268.
Notice of Allowance for U.S. Appl. No. 16/566,583, dated Nov. 3, 2020, 11 pages.
Notice of Allowance for U.S. Appl. No. 16/249,420, dated Nov. 18, 2020, 8 pages.
U.S. Appl. No. 15/719,345, "Notice of Allowance", dated Sep. 3, 2020, 12 pages.
U.S. Appl. No. 16/454,787, "Notice of Allowance", dated Sep. 9, 2020, 9 pages.
U.S. Appl. No. 16/707,988, "Non-Final Office Action", dated Sep. 22, 2020, 15 pages.

* cited by examiner

900 ─┐

┌─────────────────────────────────────────────────────────────────────┐
│ Enabling, by an interface circuit, a photodiode of a light sensing circuit to accumulate │
│ charge responsive to incident light within a integration period, wherein the light sensing │─ 902
│ circuit and the interface circuit are in, respectively, a first semiconductor die and a │
│ second semiconductor die forming a stack │
└─────────────────────────────────────────────────────────────────────┘
                                    ↓
┌─────────────────────────────────────────────────────────────────────┐
│ Transferring, by the interface circuit, the charge from the photodiode to a charge sensing │─ 904
│ device of the light sensing circuit │
└─────────────────────────────────────────────────────────────────────┘
                                    ↓
┌─────────────────────────────────────────────────────────────────────┐
│ Performing, by the interface circuit and using a sampling capacitor, a sample-and-hold │─ 906
│ operation to convert the charge stored in the charge sensing device into a voltage │
└─────────────────────────────────────────────────────────────────────┘
                                    ↓
┌─────────────────────────────────────────────────────────────────────┐
│ Generating, by the interface circuit, a digital output based on the voltage to represent an │─ 908
│ intensity of the incident light received by the photodiode │
└─────────────────────────────────────────────────────────────────────┘

FIG. 9

GLOBAL SHUTTER IMAGE SENSOR

RELATED APPLICATION

This patent application claims priority to U.S. Provisional Patent Application Ser. No. 62/652,220, filed Apr. 3, 2018, entitled "GLOBAL SHUTTER IMAGE SENSOR," which is assigned to the assignee hereof and is incorporated herein by reference in its entirety for all purposes.

BACKGROUND

The disclosure relates generally to image sensors, and more specifically to pixel cell structure including interfacing circuits to determine light intensity for image generation.

A typical image sensor includes an array of photodiodes to sense incident light by converting photons into charge (e.g., electrons or holes). To reduce image distortion, a global shutter operation can be performed in which each photodiode of the array of photodiodes senses the incident light simultaneously to generate charge. The charge generated by the array of photodiodes can then be quantized by an analog-to-digital converter (ADC) into digital values to generate the image.

SUMMARY

The present disclosure relates to image sensors. More specifically, and without limitation, this disclosure relates to a pixel cell. This disclosure also relates to operating the circuitries of pixel cells to generate a digital representation of the intensity of incident light.

In one example, a pixel cell is provided. The pixel cell includes a first semiconductor die, the first semiconductor die including a photodiode and a charge sensing device. The pixel cell further includes a sampling capacitor, and a second semiconductor die forming a stack with the first semiconductor die, the second semiconductor die including an interface circuit coupled with the photodiode, the charge sensing device, and the sampling capacitor. The interface circuit is configured to: enable the photodiode to accumulate charge responsive to incident light within a integration period; transfer the charge from the photodiode to the charge sensing device; perform, using the sampling capacitor, a sample-and-hold operation to convert the charge in the charge sensing device into a voltage; and generate a digital output based on the voltage to represent an intensity of the incident light received by the photodiode.

In some aspects, the pixel cell further includes a sampling switch coupled between the charge sensing device and the sampling capacitor. The interface circuit is configured to, as part of the sample-and-hold operation: enable the sampling switch to cause the sampling capacitor to sample the charge accumulated in the charge sensing device to develop the voltage; and disable the sampling switch to cause the sampling capacitor to hold the voltage.

In some aspects, the voltage is a first voltage. The charge sensing device is configured to output a second voltage based on the stored charge. The pixel cell further includes a voltage buffer coupled between the charge sensing device and the sampling capacitor and configured to buffer the second voltage to output the first voltage to the sampling capacitor. The sampling capacitor is operated to sample the first voltage received from the voltage buffer when the sampling switch is enabled, and to hold the first voltage after the sampling switch is disabled.

In some aspects, the sampling switch and the voltage buffer are included in the first semiconductor die.

In some aspects, the sampling capacitor includes at least one of: a metal capacitor or a semiconductor capacitor sandwiched between the first semiconductor die and the second semiconductor die in the stack, or a metal capacitor or a semiconductor capacitor formed in the second semiconductor die.

In some aspects, the interface circuit further comprises a resettable comparator. The pixel cell further comprises an AC capacitor coupled between the sampling capacitor and the comparator. The interface circuit is configured to, when the sampling switch is enabled: control the comparator to enter a reset state; operate the AC capacitor to: obtain a first sample of a reset voltage of the charge sensing device caused by a prior reset operation of the charge sensing device; obtain a second sample of an offset of the comparator when the comparator is in the reset state; store a third voltage across the AC capacitor based on the first sample of the reset voltage and the second sample of the offset; and output a fourth voltage to the comparator based on the first voltage and the third voltage. The digital output is generated based on the fourth voltage.

In some aspects, the pixel cell further comprises a transfer switch coupled between the photodiode and the charge sensing device. The interface circuit is configured to: control the comparator to exit the reset state to hold the third voltage across the AC capacitor; enable the transfer switch to transfer the charge from the photodiode to the charge sensing device, wherein the transfer of the charge develops the first voltage at the sampling capacitor; and disable the transfer switch to stop the transfer of the charge, wherein the disabling of the transfer switch causes the sampling capacitor to hold the first voltage and the AC capacitor to hold the fourth voltage for the generation of the digital output.

In some aspects, an output of the comparator of the pixel cell is coupled with a memory. The memory is coupled with a counter configured to update a count value periodically based on a clock. The comparator is configured to, after the transfer switch is disabled, compare the fourth voltage against a ramping threshold to output a decision. The memory is configured to store the count value from the counter based on the decision. The stored count value represents the digital output.

In some aspects, the pixel cell further comprises a selection switch coupled between the output of the comparator and the memory. The interface circuit is configured to: enable the selection switch to transmit the decision to the memory when the pixel cell is selected to store the digital output in the memory; and disable the selection switch to block the decision from the memory when the pixel cell is not selected to store the digital output in the memory.

In some aspects, the memory and the counter are included in the second semiconductor die.

In some aspects, the pixel cell further comprises a shutter switch coupled between the photodiode and a charge sink. The interface circuit is configured to: disable the shutter switch to start the integration period and to enable the photodiode to accumulate the charge, and enable the shutter switch to end the integration period and to prevent the photodiode from accumulating the charge.

In some aspects, the charge sensing device comprises at least one of: a floating drain node, or a pinned storage node.

In some examples, an image sensor is provided. The image sensor comprises a first semiconductor die, the first semiconductor die including an array of light sensing circuits, each light sensing circuit of the array of light sensing circuits comprising a photodiode and a charge sensing device. The image sensor further comprises an array of sampling capacitors, each sampling capacitor of the array of sampling capacitors corresponding to a light sensing circuit of the array of light sensing circuits. The image sensor further comprises a second semiconductor die forming a stack with the first semiconductor die, the second semiconductor die including an array of interface circuits, each interface circuit of the array of interface circuits, each light sensing circuit of the array of light sensing circuits, and each sampling capacitor of the array of sampling capacitors forming a pixel cell. Each interface circuit of the each pixel cell is configured to: enable the photodiode of the corresponding light sensing circuit to accumulate charge responsive to incident light within a global integration period; transfer the charge from the photodiode to the charge sensing device of the corresponding light sensing circuit; perform, using the corresponding sampling capacitor, a sample-and-hold operation on the charge stored in the charge sensing device to obtain a voltage; and generate a digital output based on the voltage to represent an intensity of the incident light received by the corresponding pixel cell.

In some aspects, in the each pixel cell: the light sensing circuit further includes a sampling switch coupled between the charge sensing device and the sampling capacitor. The interface circuit is configured to, as part of the sample-and-hold operation: enable the sampling switch to cause the sampling capacitor to sample the charge stored in the charge sensing device to develop the voltage; and disable the sampling switch to cause the sampling capacitor to hold the voltage.

In some aspects, in the each pixel cell: the voltage is a first voltage. The charge sensing device is configured to output a second voltage based on the stored charge. The light sensing circuit further includes a voltage buffer coupled between the charge sensing device and the sampling capacitor and configured to buffer the second voltage to output the first voltage to the sampling capacitor. The sampling capacitor is operated to sample the first voltage received from the voltage buffer when the sampling switch is enabled, and to hold the first voltage after the sampling switch is disabled.

In some aspects, in the each pixel cell: the each interface circuit further comprises a resettable comparator. The each light sensing circuit further comprises an AC capacitor coupled between the sampling capacitor and the comparator. The each interface circuit is configured to, when the sampling switch is enabled: control the comparator to enter a reset state; operate the AC capacitor to: obtain a first sample of a reset voltage of the charge sensing device caused by a prior reset operation of the charge sensing device; obtain a second sample of an offset of the comparator when the comparator is in the reset state; store a third voltage across the AC capacitor based on the first sample of the reset voltage and the second sample of the offset; and output a fourth voltage to the comparator based on the first voltage and the third voltage. The digital output is generated based on the fourth voltage.

In some aspects, the each light sensing circuit further comprises a transfer switch coupled between the photodiode and the charge sensing device. The each interface circuit is configured to: control the comparator to exit the reset state to hold the third voltage across the AC capacitor; enable the transfer switch to transfer the charge from the photodiode to the charge sensing device, wherein the transfer of the charge develops the first voltage at the sampling capacitor; and disable the transfer switch to stop the transfer of the charge, wherein the disabling of the transfer switch causes the sampling capacitor to hold the first voltage and the AC capacitor to hold the fourth voltage for the generation of the digital output.

In some aspects, the image sensor further includes a controller, a counter, and a bank of memory buffers. Each memory buffer of the bank of memory buffers is coupled with the counter. The counter is configured to update a count value periodically based on a clock. An output of the comparator of the each interface circuit is coupled to the each memory buffer via a selection switch controlled by the controller. The comparator is configured to, after the transfer switch is disabled, compare the fourth voltage against a ramping threshold to generate a decision. The controller is configured to, at different times, enable the selection switches of subsets of the pixel cells to transmit the decisions of the comparators of the selected subsets of the pixel cells to the bank of memory buffers. The bank of memory buffers is configured to store the count values from the counter based on the decisions of the selected subsets of the pixel cells at the different times. The stored count values represent the digital outputs of the pixel cells.

In some example, a method is provided. The method comprises: enabling, by an interface circuit, a photodiode of a light sensing circuit to accumulate charge responsive to incident light within a integration period, wherein the light sensing circuit and the interface circuit are in, respectively, a first semiconductor die and a second semiconductor die forming a stack; transferring, by the interface circuit, the charge from the photodiode to a charge sensing device of the light sensing circuit; performing, by the interface circuit and using a sampling capacitor, a sample-and-hold operation to convert the charge stored in the charge sensing device into a voltage; and generating, by the interface circuit, a digital output based on the voltage to represent an intensity of the incident light received by the photodiode.

In some aspects, the method further comprises: comparing the voltage with a ramping threshold to output a decision; controlling a memory to store a count value from a counter based on the decision; and providing the count value as the digital output. The memory and the counter is in the second semiconductor die.

BRIEF DESCRIPTION OF THE DRAWINGS

Illustrative embodiments are described with reference to the following figures.

FIG. 9 illustrates a flowchart of an example process for measuring light intensity.

Figure 1A:
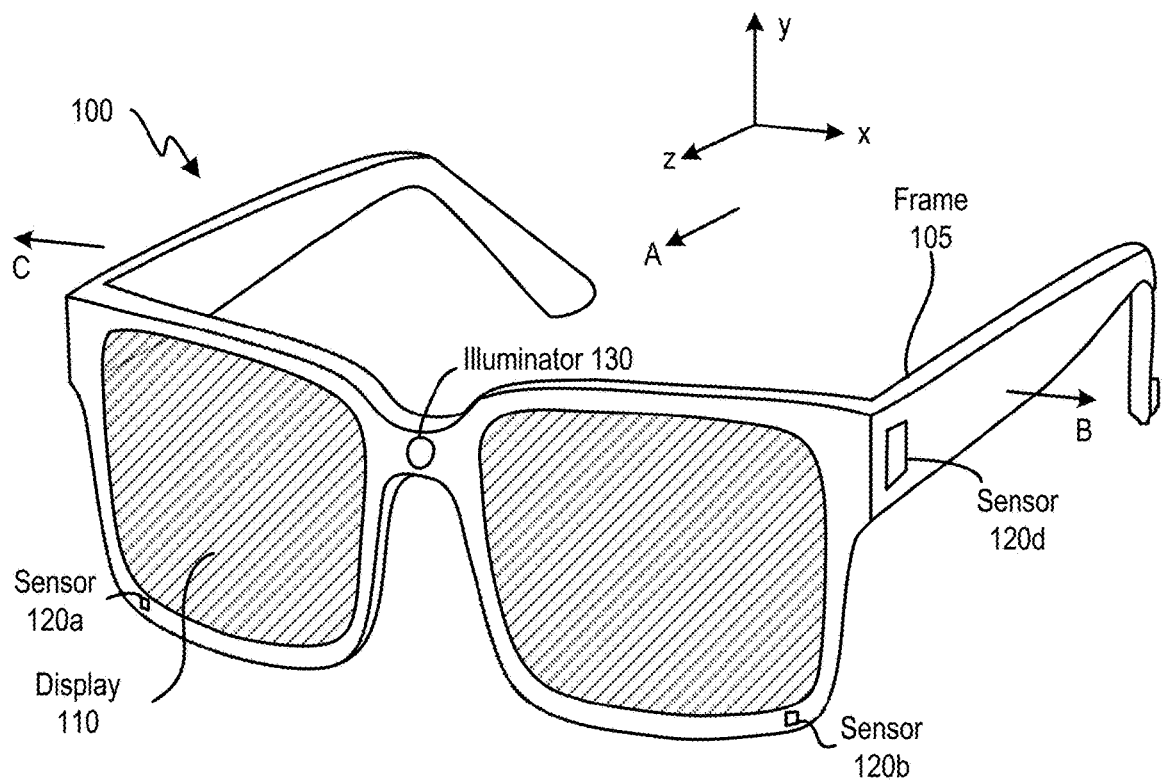
FIG. 1A and FIG. 1B are diagrams of an embodiment of a near-eye display.
Figure 1A:
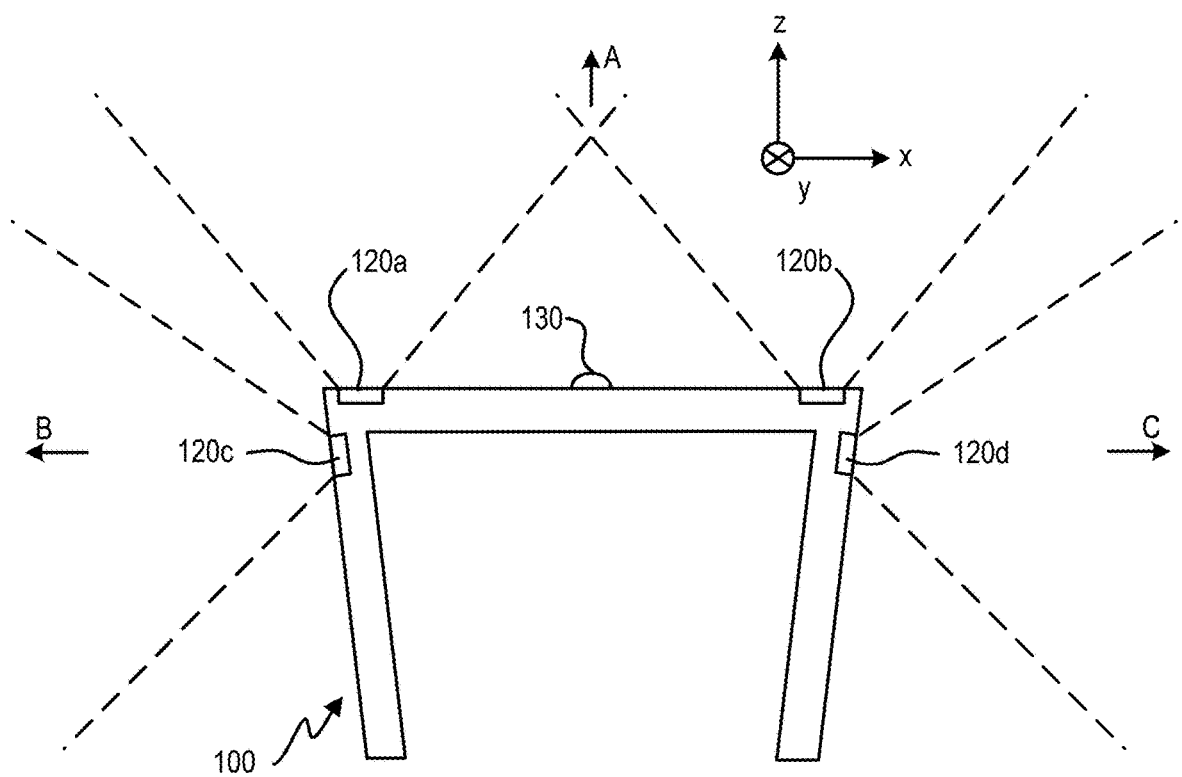

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes an array of pixel cells. Each pixel cell includes a photodiode to sense incident light by converting photons into charge (e.g., electrons or holes). The charge generated by photodiodes of the array of pixel cells can then be quantized by an analog-to-digital converter (ADC) into digital values. The ADC can quantize the charge by, for example, using a comparator to compare a voltage representing the charge with one or more quantization levels, and a digital value can be generated based on the comparison result. The digital values can then be stored in a memory to generate the image.

Due to power and chip area limitation, typically the ADC and the memory are shared by at least some of the pixel cells, instead of providing a dedicated ADC and a memory to each pixel cell. A rolling shutter operation can be performed to accommodate the sharing of the ADC and the memory among the pixel cells. For example, the array of pixel cells can be divided into multiple groups (e.g., rows or columns of pixel cells), with the pixels of each group sharing an ADC and the memory. To accommodate the sharing of the ADC and the memory, a rolling shutter operation can be performed in which each pixel cell within the group can take a turn to be exposed to incident light to generate the charge, followed by accessing the ADC to perform the quantization of the charge into a digital value, and storing the digital value into the memory. As the rolling shutter operation exposes different pixel cells to incident light at different times, an image generated from the rolling shutter operation can experience distortion, especially for images of a moving object and/or images captured when the image sensor is moving. The potential distortion introduced by rolling shutter operation makes it unsuitable for augmented reality/mixed reality/virtual reality (AR/MR/VR) applications, wearable applications, etc., in which the image sensor can be part of a headset and can be in motion when capturing images.

To reduce image distortion, a global shutter operation can be performed in which each pixel cell of the array of pixel cells is exposed to incident light to generate charge simultaneously within a global shutter period (or a global integration period). Each pixel cell can include a charge sensing device to temporarily store the charge generated by the photodiode. When the pixel cell is granted access to the ADC and to the memory, the pixel cell can provide the charge from the charge sensing device to the ADC to perform the quantization to generate the digital value, and then store the digital value in the memory.

There are various techniques to implement a charge sensing device in a pixel cell, such as implementing the charge sensing device as a floating drain node, a pinned storage node (of a pinned diode), etc. But a charge sensing device implemented using these techniques is susceptible to noise charge, which can degrade the correlation between the charge stored in the charge sensing device and the incident light intensity and reduce the sensitivity of the pixel cell. For example, a floating drain node configured as a charge sensing device can be susceptible to dark current, which can be leakage currents generated at the p-n junction of a semiconductor device due to crystallographic defects. The dark current can flow into the charge sensing device and add to the charge generated by the photodiode. As another example, a pinned storage node can generate charge when photons of the incident light penetrate into the semiconductor substrate of the pixel cell and reach the pinned storage node. The charge generated by the charge sensing device can add to the charge generated by the photodiode. In both cases, the charge stored in the charge sensing device is different from the charge generated by the photodiode during the global shutter period, and the quantization result of the charge in the charge sensing device may not provide an accurate representation of the incident light intensity.

There are other noise sources that can further degrade the accurate representation of the incident light intensity. For example, during the reset of the charge sensing device between measurements, thermal noise (as well as other noises, such as 1/f noise, etc.) can be injected into the charge sensing device as reset noise, which adds charge not reflecting the incident light intensity to the floating node. Moreover, as discussed above, the quantization process typically includes using a comparator to compare a voltage representing the charge with one or more quantization levels, and a digital value can be generated based on the results of the comparisons. The comparator offset can also lead to errors in the comparison with the quantization levels, which can introduce errors in the digital value.

This disclosure relates to a pixel cell that can improve a global shutter operation. In one example, a pixel cell can include a first semiconductor die, a sampling capacitor, and a second semiconductor die. The first semiconductor die includes a light receiving surface, a photodiode to receive incident light via the light receiving surface, and a charge sensing device to accumulate charge generated by the photodiode. The second semiconductor die forms a stack with the first semiconductor die and includes an interface circuit coupled with the sampling capacitor, the photodiode, and the charge sensing device. The sampling capacitor may include a metal capacitor sandwiched between the first and second semiconductor dies within the stack, or may include a device capacitor formed in the second semiconductor die. The charge sensing device may include a floating drain node, a pinned storage node, etc.

To perform sensing of incident light, the interface circuit can expose the photodiode to the incident light within an integration period to cause the photodiode to generate charge. The interface circuit can perform, using the sampling capacitor, a sample-and-hold operation on the charge accumulated in the storage device within the integration period to obtain a voltage. More specifically, the pixel cell can include a sampling switch coupled between the charge sensing device and the sampling capacitor to support the sample-and-hold operation. The interface circuit can enable the sampling switch to cause the sampling capacitor to sample the charge accumulated in the storage device to develop the voltage, and then disable the sampling switch to cause the sampling capacitor to hold the voltage. The voltage held at the sampling capacitor, after the sampling switch is disabled, can be quantized to generate the digital output.

The interface circuit of the pixel cell may include a comparator to perform the quantization. The comparator can be coupled with a memory and a counter, both of which can be external to the pixel cell. The counter can update a count value periodically based on a clock. The comparator can compare the voltage held at the sampling capacitor against a ramping threshold to generate a decision. Based on the decision, the memory can store the count value from the counter. The count value stored in the memory can be the digital output.

In some examples, to further improve the accuracy of sensing of the incident light, an AC capacitor can be provided between the sampling capacitor and the comparator to store a second voltage representing the reset noise introduced to the charge sensing device and the offset of the comparator. The AC capacitor can also include a metal capacitor sandwiched between the first and second semiconductor dies within the stack. The AC capacitor can combine the second voltage with the voltage held at the sampling capacitor ("a first voltage") to output a third voltage to the comparator, with the reset noise component removed from the third voltage as a result of the combination. The comparator can compare the third voltage with the thresholds to perform the quantization operation, in which the comparator offset component in the third voltage can compensate for the actual offset of the comparator.

The disclosed techniques can improve light sensing in numerous ways. First, the sampling capacitor can provide an additional charge sensing device to store the charge generated by the photodiode. The sampling capacitor can also be less susceptible to noise charge. For example, the sampling capacitor can be a metal capacitor which is less susceptible to dark current due to crystallographic defects and which does not generate charge when receiving photons. Combined with the techniques of pre-storing the reset noise and the comparator offset in an AC capacitor to reduce the effect of the reset noise and comparator offset on the quantization operation as described above, the accuracy of the light sensing operation, and the fidelity of the image generation operation, can be substantially improved.

The disclosed techniques can also reduce the footprint of the pixel cells, which allows packing a large number of pixel cells in an image sensor to improve resolution while minimizing the footprint of the image sensor. For example, by stacking the photodiode with the processing circuit to form a pixel cell, and by putting the memory external to the pixel cell, the footprint of the pixel cell can be reduced. Moreover, by forming the sampling capacitor and the AC capacitor between the semiconductor dies, these capacitors do not cover the light receiving surface, which can maximize the available pixel cell area for the light receiving surface and allows the footprint of the pixel cell to be further reduced. With the disclosed techniques, a high resolution image sensor with a small footprint can be achieved, which is especially useful for applications on a wearable device (e.g., a headset) where available space is very limited.

The disclosed techniques can also improve reliability and speed of image generation. For example, as the memory is positioned outside the pixel cell and does not affect the footprint of the pixel cell, redundant memory devices can be provided to store the digital outputs from each pixel cell to reduce the likelihood of losing the digital outputs (and the pixel values) due to defective memory. But since the memory comprises mostly digital circuits and typically has a very small footprint, adding redundant memory (to be shared by the pixel cells) typically does not significantly increase the footprint of the image sensor. Moreover, compared with an implementation where the pixel cell transmits an analog voltage (e.g., a voltage at the charge sensing device) to an external ADC to perform the quantization operation, the disclosed techniques allow a part of the quantization (the comparator comparison) operation to be performed within the pixel cell, and only a digital output (the decision of the comparator) is transmitted from the pixel cell to the external memory. Compared with an analog voltage, the digital output can be transmitted with high fidelity (to distinguish between zeroes and ones) and at high speed. All these can improve the reliability and speed of image generation based on the light sensing operations by the pixel cells.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120*a*, 120*b*, 120*c*, and 120*d*. Each of image sensors 120*a*, 120*b*, 120*c*, and 120*d* may include a pixel array configured to generate image data representing different fields of views along different directions. For example, sensors 120*a* and 120*b* may be configured to provide image data representing two fields of view towards a direction A along the Z axis, whereas sensor 120*c* may be configured to provide image data representing a field of view towards a direction B along the X axis, and sensor 120*d* may be configured to provide image data representing a field of view towards a direction C along the X axis.

In some embodiments, sensors 120*a*-120*d* can be configured as input devices to control or influence the display content of the near-eye display 100, to provide an interactive VR/AR/MR experience to a user who wears near-eye display 100. For example, sensors 120*a*-120*d* can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120*a*-120*d* can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120*a*-120*d* in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120*a* or 120*b* can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120*a*-120*d* may need to have a wide dynamic range to be able to operate properly (e.g., to generate an output that correlates with the intensity of incident light) across a very wide range of light intensities associated with different operating environments for near-eye display 100.

Figure 1B:
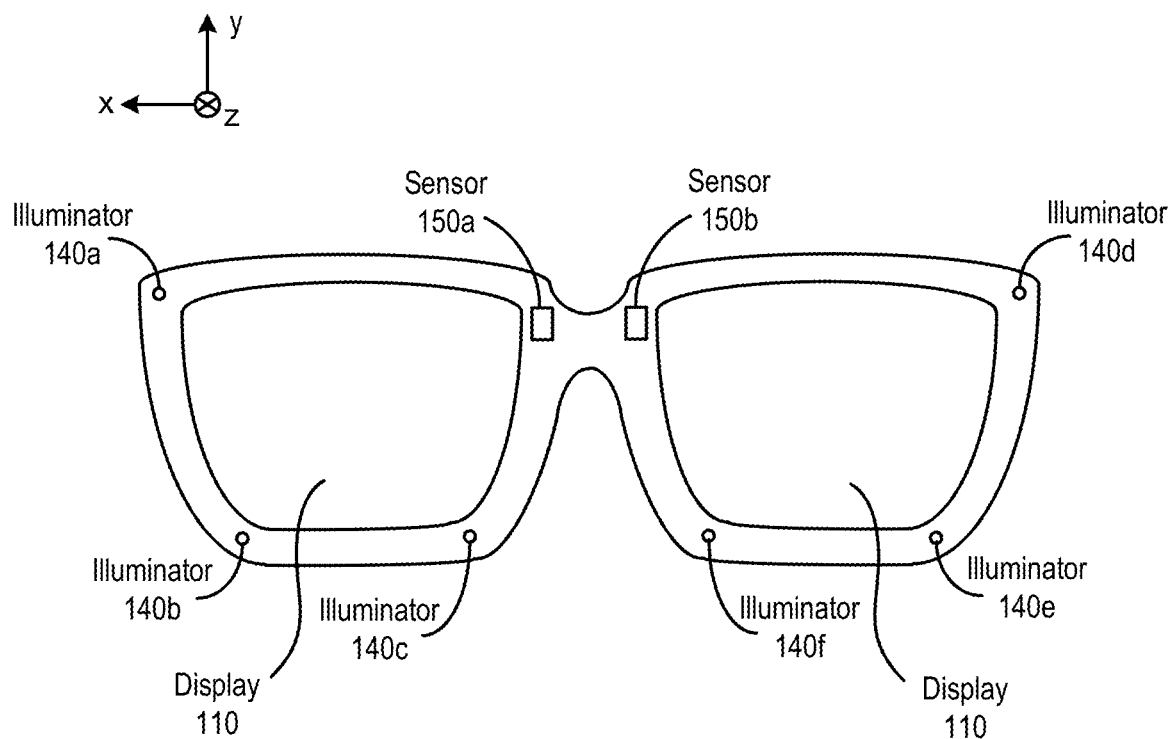
Figure 1B:
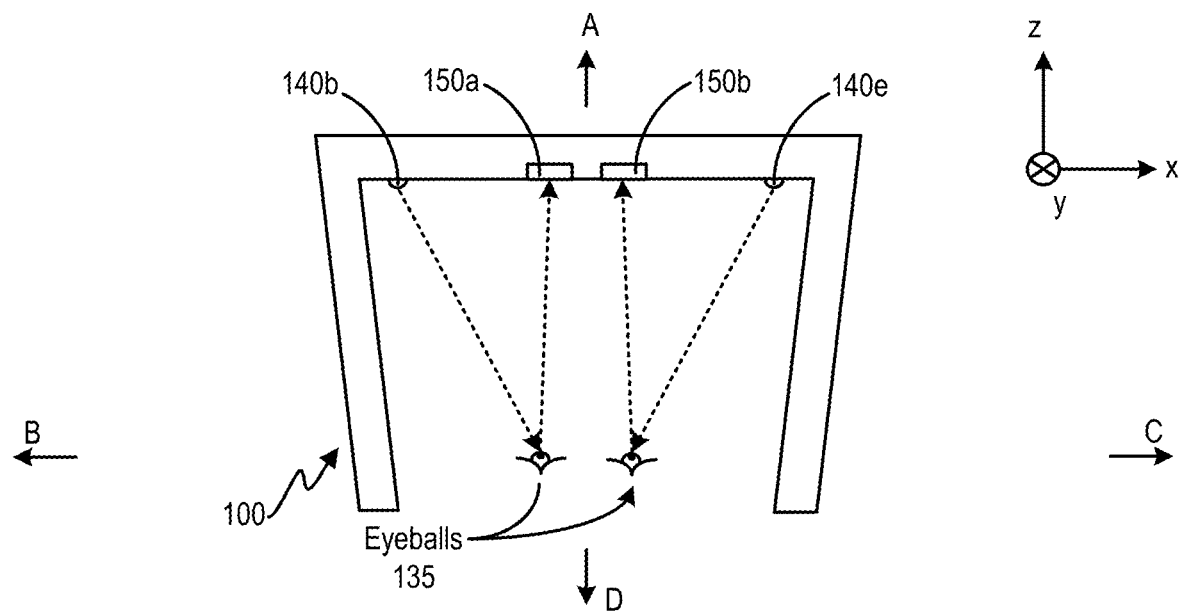

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140*a*, 140*b*, 140*c*, 140*d*, 140*e*, and 140*f*. Near-eye display 100 further includes a plurality of image sensors 150*a* and 150*b*. Illuminators 140*a*, 140*b*, and 140*c* may emit lights of certain frequency range (e.g., NIR) towards direction D (which is opposite to direction A of FIG. 1A). The emitted light may be associated with a certain pattern, and can be reflected by the left eyeball of the user. Sensor 150*a* may include a pixel array to receive the reflected light and generate an image of the reflected pattern. Similarly, illuminators 140*d*, 140*e*, and 140*f* may emit NIR lights carrying the pattern. The NIR lights can be reflected by the right eyeball of the user, and may be received by sensor 150*b*. Sensor 150*b* may also include a pixel array to generate an image of the reflected pattern. Based on the images of the reflected pattern from sensors 150*a* and 150*b*, the system can determine a gaze point of the user, and update the image data provided to display 100 based on the determined gaze point to provide an interactive experience to the user.

As discussed above, to avoid damaging the eyeballs of the user, illuminators 140*a*, 140*b*, 140*c*, 140*d*, 140*e*, and 140*f* are typically configured to output lights of very low intensities. In a case where image sensors 150*a* and 150*b* comprise the same sensor devices as image sensors 120*a*-120*d* of FIG. 1A, the image sensors 120*a*-120*d* may need to be able to generate an output that correlates with the intensity of incident light when the intensity of the incident light is very low, which may further increase the dynamic range requirement of the image sensors.

Moreover, the image sensors 120*a*-120*d* may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120*a*-120*d* need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 2:
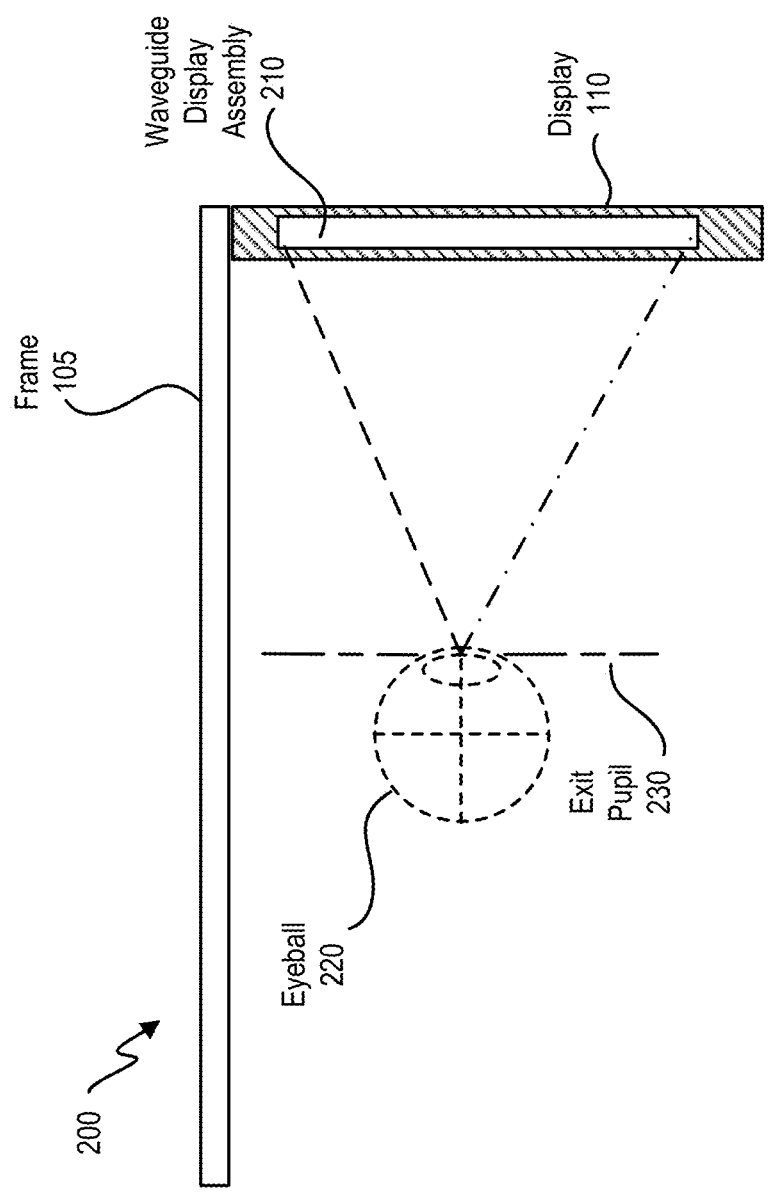
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
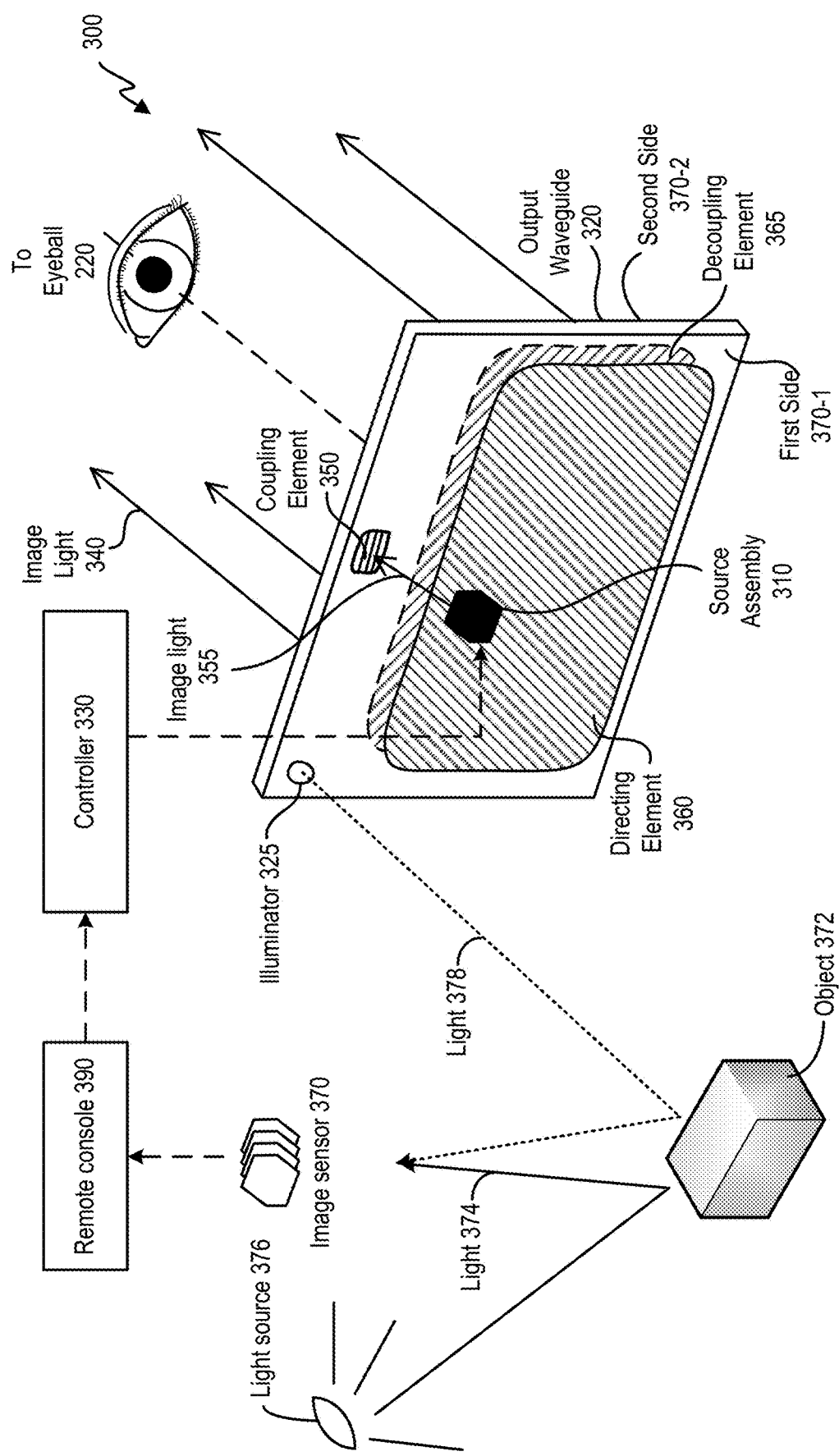
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
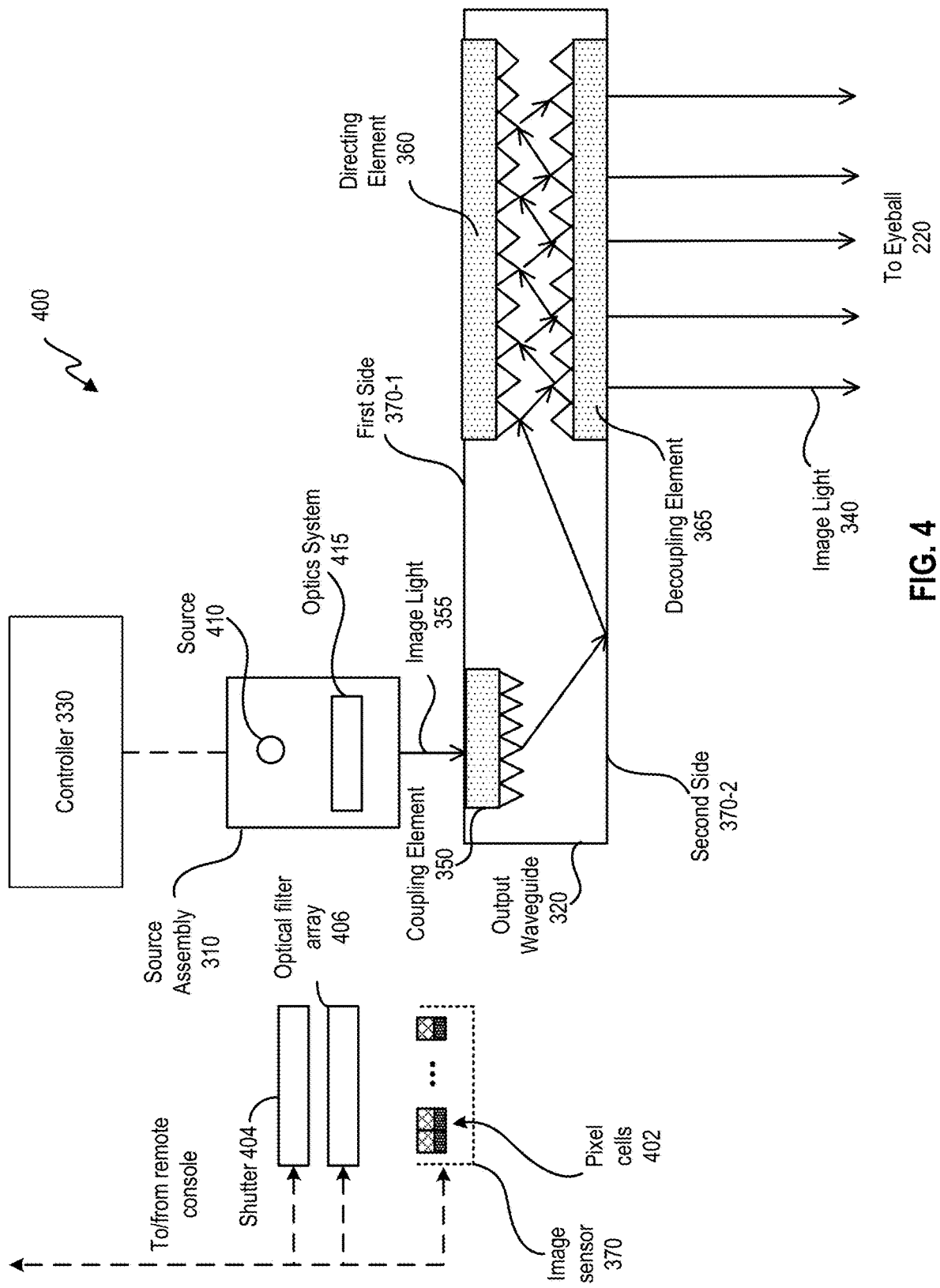
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
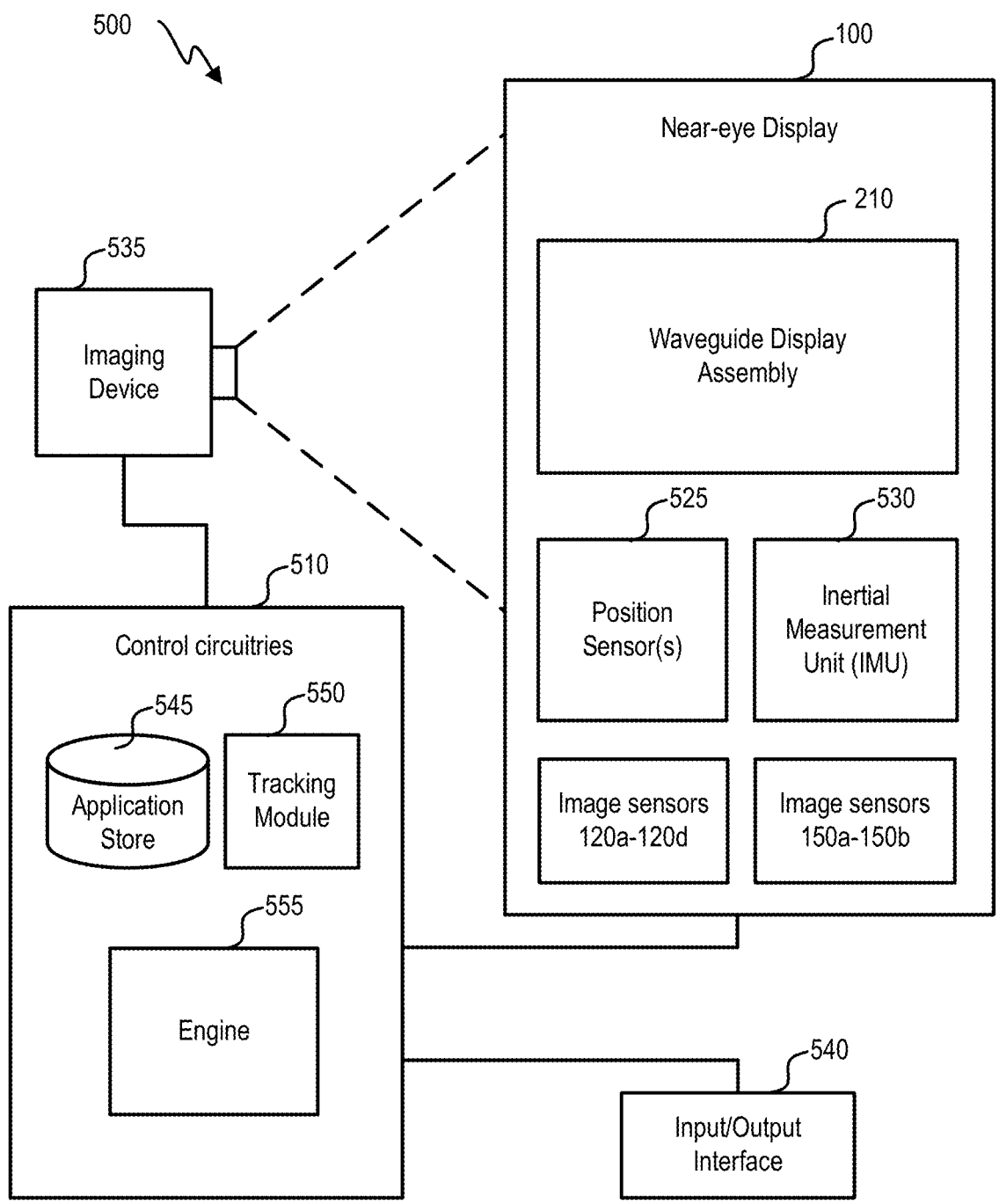
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6A:
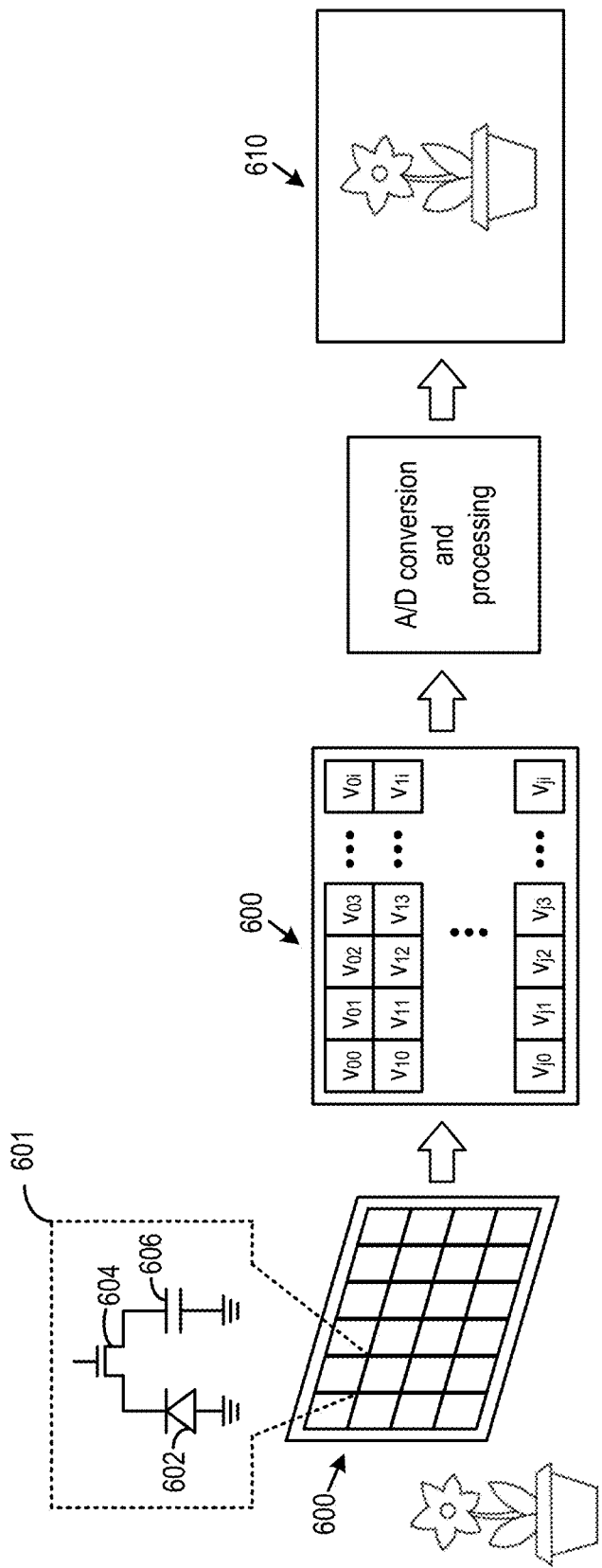
FIG. 6A, FIG. 6B, and FIG. 6C illustrate examples of a pixel cell and their operations.
Figure 6C:
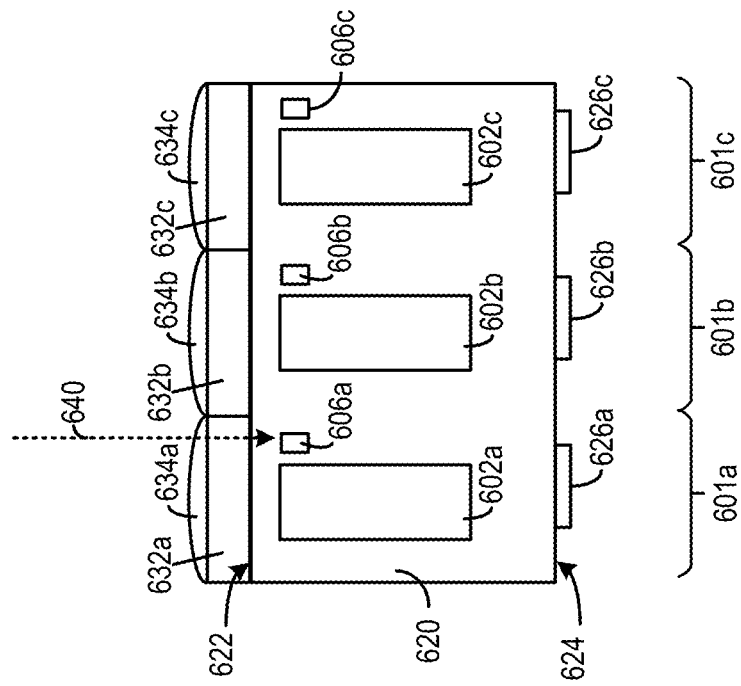
Figure 6B:
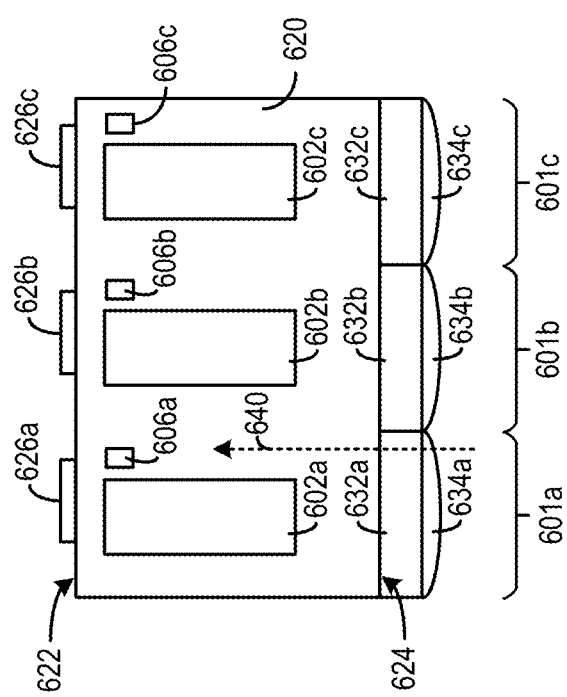

FIG. 6A, FIG. 6B, and FIG. 6C illustrates examples of an image sensor and its operations. As shown in FIG. 6A, image sensor 600 can include an array of pixel cells, including pixel cell 601, and can generate digital intensity data corresponding to pixels of an image. Pixel cell 601 may be part of pixel cells 402 of FIG. 4. As shown in FIG. 6A, pixel cell 601 may include a photodiode 602, a transfer gate 604, and a charge sensing device 606. Photodiode 602 may include, for example, a P-N diode, a P-I-N diode, a pinned diode, etc. Photodiode 602 can generate charge upon receiving light within an exposure period, and the quantity of charge generated within the exposure period can be proportional to the intensity of the light. Photodiode 602 can also store the generated charge. Transfer gate 604 may include, for example, a metal-oxide-semiconductor field-effect transistor (MOSFET), a bipolar junction transistor (BJT), etc. Charge sensing device 606 may include, for example, a floating drain (FD) node of the transistor of transfer gate 604, a pinned storage device formed from a pinned diode, etc. Towards the end of the exposure period, the transfer gate 604 can be enabled to transfer the charge stored in photodiode 602 to charge sensing device 606 to develop a voltage. An array of voltages, including $v_{00}$, $v_{01}$, ... $v_{ji}$, can be obtained. The array of voltages can be quantized by an A/D converter (which can be external or internal to the pixel cells) into digital values. The digital values can be further processed to generate an image 610.

In FIG. 6A, the presence of charge sensing device 606 in each pixel cell enables image sensor 600 to perform a global shutter operation, even if the pixel cells have to share the A/D converter. Specifically, photodiode 602 of each pixel cell can be exposed to incident light within the same global exposure period to generate charge. The charge can be temporarily stored at charge sensing device 606 of the pixel cell at least until that pixel cell can access the A/D converter to quantize the charge. With such arrangements, a global shutter operation can be supported even if the voltages generated by the pixel cells are not quantized simultaneously.

FIG. 6B and FIG. 6C illustrate cross-sectional views of examples of image sensor 600. Image sensor 600 can include a plurality of pixel cells 601 (e.g., pixel cells 601a, 601b, 601c, etc.), with each pixel cell including photodiode 602 (e.g., photodiodes 602a, 602b, 602c, etc.) and charge sensing devices 606 (e.g., charge sensing devices 606a, 606b, 606c, etc.). Charge sensing devices 606 can be, for example, pinned storage nodes, floating drain nodes, etc. As shown in FIG. 6B and FIG. 6C, image sensor 600 can be included in a semiconductor die 620 having a front side surface 622 and a back side surface 624. Front side surface 622 can be the front side of a semiconductor wafer from which semiconductor die 620 is fabricated, whereas back side surface 624 can be the back side of the semiconductor wafer. The front side of the semiconductor wafer can receive doping, ion implantation, etc., to form photodiode 602 and charge sensing devices 606, such that both photodiodes 602 and charge sensing devices 606 are closer to front side surface 622 than back side surface 624. Metal interconnects 626 (e.g., metal interconnects 626a, 626b, 626c, etc.) can be formed on front side surface 622, as shown in FIG. 6B, or on back side surface 624, as shown in FIG. 6C. Metal interconnects 626 can be used to transfer charge from photodiodes 602 to charge sensing devices 606.

Image sensor 600 can have different configurations. For example, as shown in FIG. 6B, image sensor 600 can have a back side illumination (BSI) configuration, in which back-side surface 624 can be a light receiving surface for image sensor 600. Moreover, as shown in FIG. 6C, image sensor 600 can have a front side illumination (FSI) configuration, in which front-side surface 622 can be a light receiving surface for image sensor 600. In both FIG. 6B and FIG. 6C, image sensor 600 may include color filters 632 (e.g., filters 632a, 632b, 632c, etc.) and microlens 634 (e.g., microlens 634a, 634b, 634c, etc.) formed on the light receiving surface. Light can go through microlens 634, color filters 632, and the light receiving surface (back side surface 624 in FIG. 6B, front side surface 622 in FIG. 6C) to reach photodiodes 602.

As described above, noise charge can be added to charge sensing devices 606, which can introduce error to the light intensity measurement operation. For example, in a case where charge sensing devices 606 are floating drain nodes, dark currents due to crystallographic defects may add noise charge to the charge transferred from photodiodes 602. As the light intensity measurement operation is based on measuring a quantity of charge generated by photodiodes 602 within the global shutter period, while the measurement is based on the charge stored in charge sensing devices 606, the noise charge from dark currents can introduce error to the light intensity measurement operation.

In a case where charge sensing devices 606 are pinned storage nodes of pinned diodes, the dark currents may be reduced compared with floating drain nodes, but the pinned diodes can receive photons 640 via the light receiving surface and generate photon noise charge responsive to photons 640, which can also be added to the charge transferred from photodiodes 602. Floating drain nodes, although being susceptible to dark currents, typically generate less photon noise charge than pinned diodes. Charge sensing devices 606 in the FSI configuration of FIG. 6C can generate more noise charge than in the BSI configuration of FIG. 6B because charge sensing devices 606 are closer to the light receiving surface in the FSI configuration, and there is a lack of light-shielding structure to block photons 640 from reaching charge sensing devices 606. As a result, in the FSI configuration, charge sensing devices 606 can receive more photons 640 and generate more noise charge compared with the BSI configuration. Moreover, as shown in FIG. 6B and FIG. 6C, in a BSI configuration photodiodes 602 are positioned further away from the light receiving surface than in a FSI configuration. As a result, in a BSI configuration incident light needs to travel through a longer distance within semiconductor 620, and therefore subject to larger power loss, before reaching photodiodes 602 than in a FSI configuration. As a result, an image sensor 600 having a BSI configuration typically provides a lower light-to-charge conversion rate than a FSI configuration, which may reduce the sensitivity of image sensor 600 especially in a low light environment.

Figures 7A, 7B:
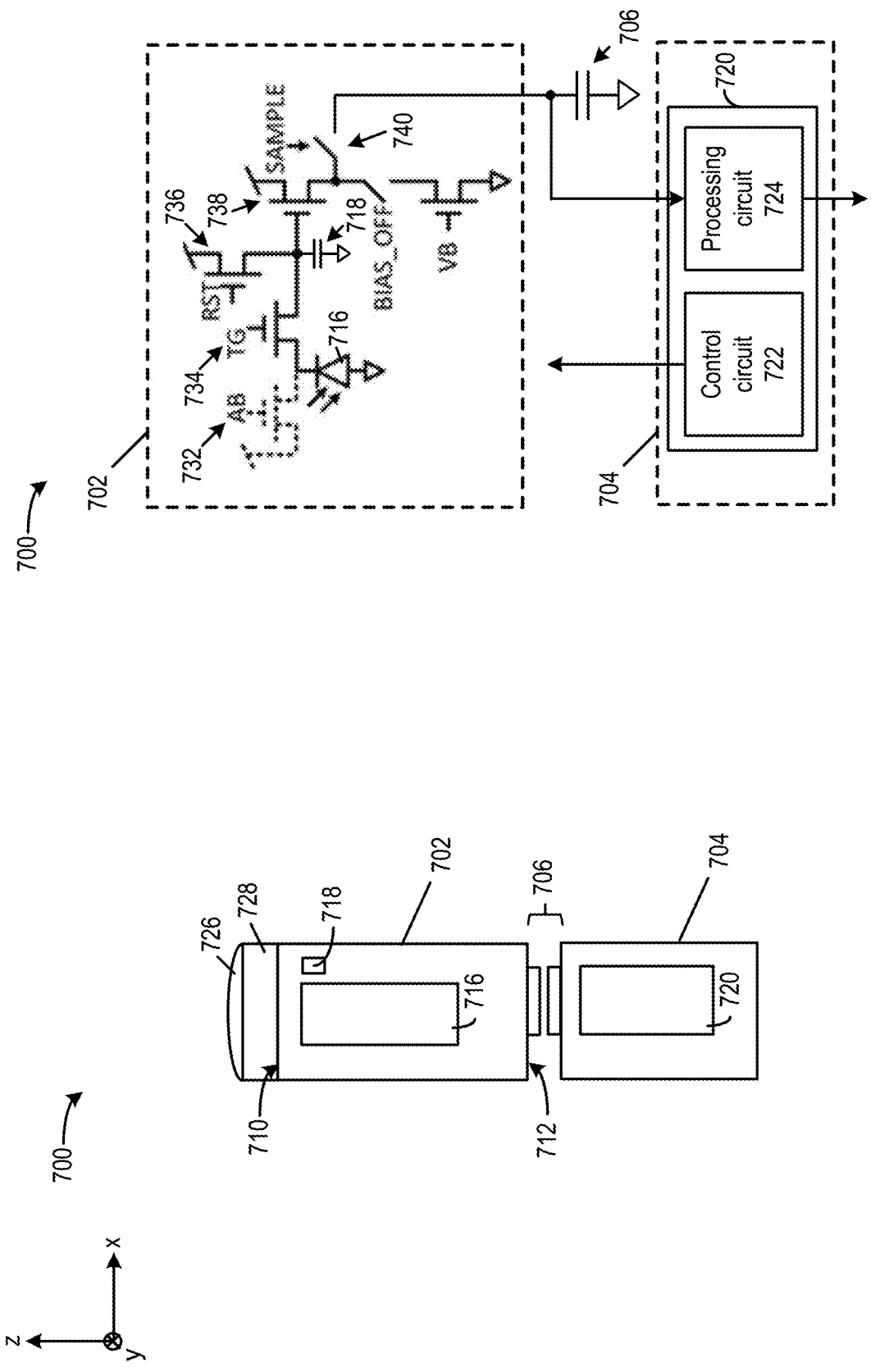
FIG. 7A, FIG. 7B, FIG. 7C, FIG. 7D, and FIG. 7E illustrate examples of a pixel cell and its operations.

FIG. 7A and FIG. 7B illustrate an example of a pixel cell 700. FIG. 7A illustrates a cross-sectional structural view of pixel cell 700, whereas FIG. 7B illustrates a schematic view of pixel cell 700. Pixel cell 700 can perform a global shutter operation with improved noise performance. As shown in FIG. 7A, a pixel cell 700 may include a first semiconductor die 702, a second semiconductor die 704, and a sampling capacitor 706 forming a stack along a vertical direction (e.g., along the z-axis). First semiconductor die 702 may include a photodiode 716 and a charge sensing device 718. Second semiconductor die 704 may include interface circuits 720. In the example of FIG. 7A, sampling capacitor 706 can include a metal capacitor formed from one or more metal layers 708 sandwiched between first semiconductor die 702 and second semiconductor die 704. In some examples, sampling capacitor 706 can also be formed as a device capacitor (e.g., a floating drain node, a pinned storage node, etc.) in one of first semiconductor die 702 or second semiconductor die 704. By stacking photodiode 716, sampling capacitor 706, and interface circuits 720 along a vertical direction, the horizontal footprint of pixel cell 700 (along the x/y axes) can be reduced, which allows packing a large number of pixel cells in an image sensor to improve resolution while minimizing the footprint of the image sensor. Moreover, by forming the sampling capacitor and the AC capacitor between the semiconductor dies, these capacitors do not cover the light receiving surface, which can maximize the available pixel cell area for the light receiving surface and allows the footprint of the pixel cell to be further reduced. With the disclosed techniques, a high resolution image sensor with a small footprint can be achieved, which is especially useful for applications on a wearable device (e.g., a headset) where available space is very limited.

As described above, first semiconductor die 702 may include photodiode 716 and charge sensing device 718. Photodiode 716 can be exposed to incident light within an integration period to generate and store charge. Towards the end of the integration period, the charge stored in photodiode 716 can be transferred to charge sensing device 718 to develop a voltage. Interface circuits 720 of second semiconductor die 704 may include a control circuit 722 to control sampling capacitor 706 to perform a sample-and-hold operation to sample the voltage and then store the voltage. Interface circuits 720 also include a processing circuit 724 to perform a quantization operation on the stored voltage to generate a digital output representing the intensity of the incident light received by photodiode 716. As to be described below, the sample-and-hold operation can reduce the exposure of sampling capacitor 706 to dark currents, which can improve the accuracy of the light sensing operation.

First semiconductor die 702 includes a front side surface 710 and a back side surface 712. Photodiode 716 and charge sensing device 718 can be formed by, for example, a doping process, an ion implantation process, etc., performed on front side surface 710, such that both photodiode 716 and charge sensing device 718 are closer to front side surface 710 than back side surface 712. To improve light-charge conversion rate, pixel cell 700 can have a FSI configuration in which front side surface 710 is configured as the light receiving surface, with a microlens 726 and a color filter 728 positioned on front side surface 710 to focus and filter the incident light. To reduce the effect of photon noise charge generation, charge sensing device 718 can be formed as a floating drain node, a metal capacitor, a polysilicon capacitor, etc.

Referring to FIG. 7B, first semiconductor die 702 further includes other circuits including, for example, an optional shutter switch 732, a transfer switch 734, a storage reset switch 736, a voltage buffer 738, and a sampling switch 740. The switches can be controlled by control circuit 722 to measure incident light intensity. Specifically, shutter switch 732 (controlled by a signal labelled "AB") can act as an electronic shutter gate (in lieu of, or in combination with, mechanical shutter 404 of FIG. 4) to control an exposure/integration period within which photodiode 716 can accumulate charge for light intensity measurement. In some examples, shutter switch 732 can also be configured as an anti-blooming gate to prevent charge generated by photodiode 716 from leaking into other pixel cells when the photodiode saturates. In addition, transfer switch 734 can be controlled to transfer the charge from photodiode 716 to charge sensing device 718 to develop a voltage, which can be buffered by voltage buffer 738. Sampling switch 740, together with sampling capacitor 706, can be controlled to perform a sample-and-hold operation of the buffered voltage. Storage reset switch 736 can reset charge sensing device 718 prior to and after the sample-and-hold operation, to start over a new light intensity measurement.

Figure 7C:
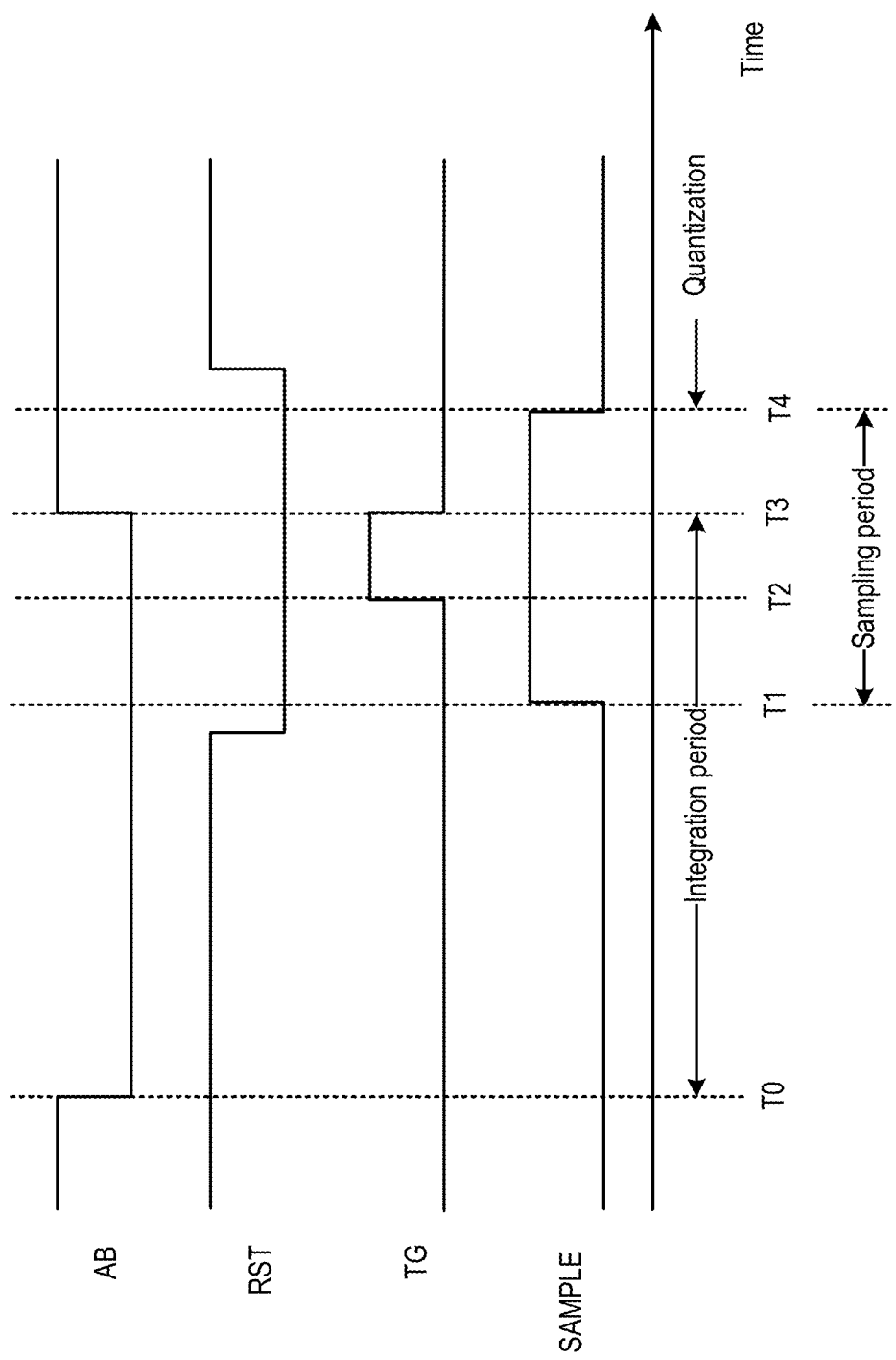

FIG. 7C illustrates an example sequence of control signals for shutter switch 732, transfer switch 734, storage reset switch 736, and sampling switch 740 to perform a sample-and-hold operation. As shown in FIG. 7C, shutter switch 732 can be disabled (by de-asserting AB signal) at time T0 to start an integration/shutter period within which photodiode 716 can accumulate charge for light intensity measurement. Between times T0 and T1, charge sensing device 718 can be in a reset state, with storage reset switch 736 enabled (by asserting the RST signal), while photodiode 716 is accumulating charge. Between times T1 and T4 can be the sampling period, within which sampling switch 740 is enabled to electrically connect sampling capacitor 706 to the output of voltage buffer 738, which buffers the voltage of charge sensing device 718. During the sampling period, storage reset switch 736 can be disabled (by de-asserting the RST signal). The voltage across sampling capacitor 706 can track the buffered voltage at charge sensing device 718. Between times T2 and T3 within the sampling period, transfer switch 734 can be enabled to transfer the charge accumulated in photodiode 716 to charge sensing device 718. At time T3 transfer switch 734 can be disabled, which ends the integration period, and the voltage at charge sensing device 718 at time T3 can represent a quantity of charge accumulated by photodiode 716 (and transferred to charge sensing device 718) within the integration period between times T0 and T3. Sampling capacitor 706 can sample the buffered voltage at charge sensing device 718 until time T4, such that the voltage at sampling capacitor 706 tracks the buffered voltage at charge sensing device 718. After time T4, sampling capacitor 706 can hold the sampled voltage, which can then be quantized by processing circuit 724 at a subsequent time after time T4.

An image sensor can include an array of pixel cells 700. To support a global shutter operation, the array of pixel cells 700 can share a global AB signal and a global TG signal so that a global integration period starts at the same time T0 and ends at the same time T3 for each pixel cell 700. The sampling capacitor 706 of each pixel cell can store the voltage representing the charge accumulated by the photodiode 716 of each pixel cell within the global integration period. The voltages stored in the pixels can then be quantized by one or more ADCs.

Compared with pixel cell 601 of FIG. 6, pixel cell 700 can provide improved noise performance. Specifically, charge sensing device 718 is in a reset state for much of the integration period (e.g., from times T0 and T1) and is out of the reset state during the sampling period. Charge sensing device 718 is more susceptible to dark currents and photons, and can accumulate more dark currents noise charge and photon noise charge, during the sampling period compared with when charge sensing device 718 is in the reset state. If the sampling period is relatively short, the noise charge added to the charge transferred from photodiode 716 can be reduced. Moreover, by performing a sample-and-hold operation, sampling capacitor 706 can be disconnected from charge sensing device 718 after sampling the buffered voltage at charge sensing device 718, which can prevent dark currents from flowing into sampling capacitor 706 from charge sensing device 718 (or other components of first semiconductor die 702) which can contaminate the sampled voltage. Further, by implementing sampling capacitor 706 as a metal capacitor rather than a floating drain node or a pinned storage node, sampling capacitor 706 can be less susceptible to dark currents and photon noise charge when holding the sampled voltage. All these can reduce the noise components in the voltage being quantized and can improve the accuracy of the light sensing operations.

Figure 7D:
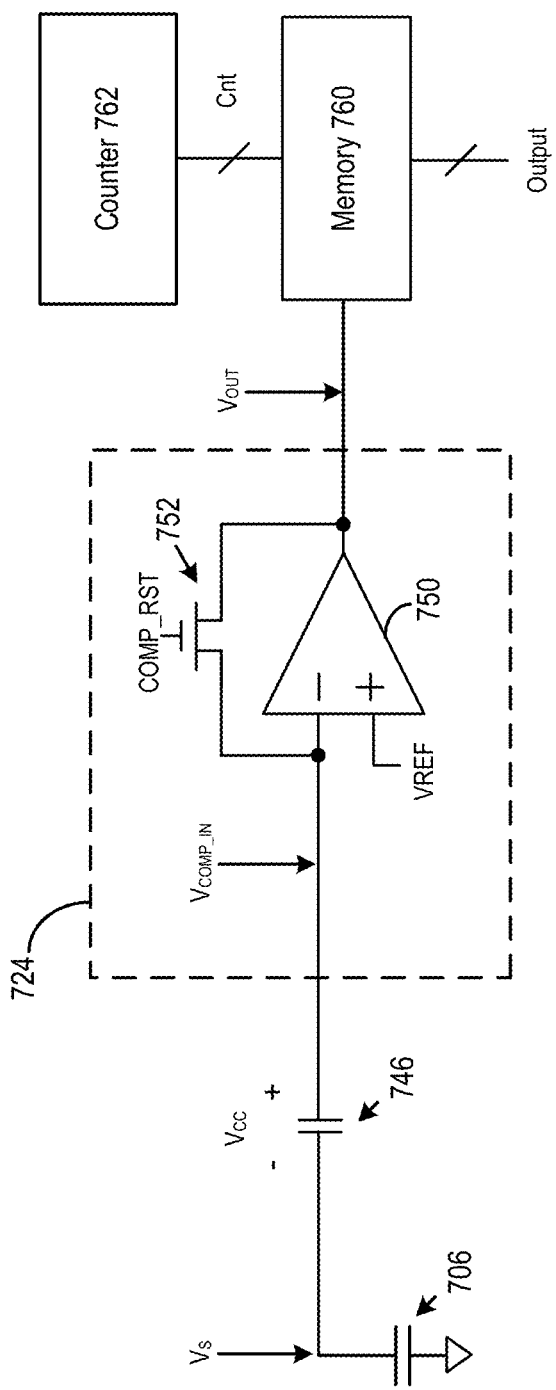
Figure 7E:
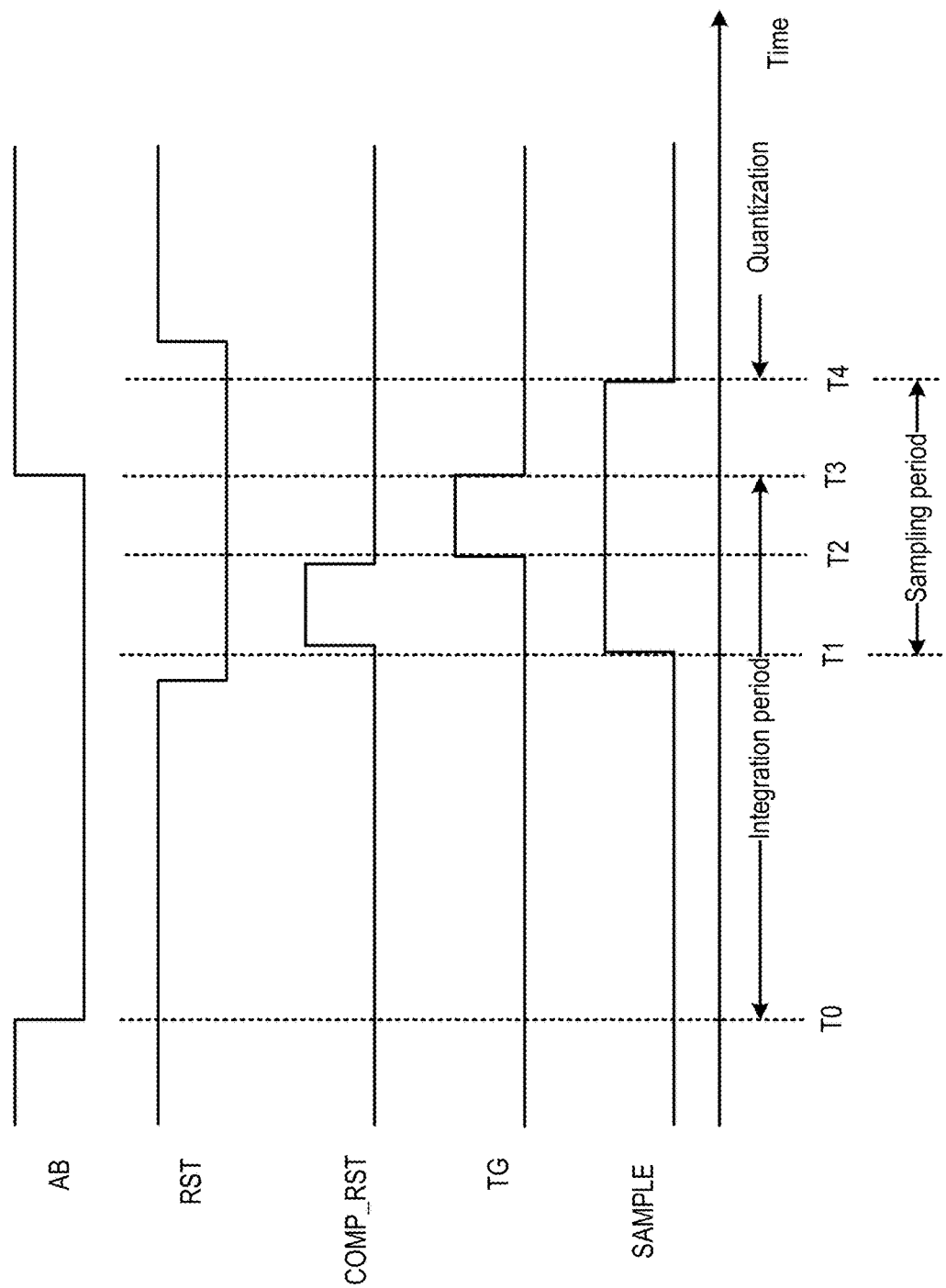

FIG. 7D illustrates an example of processing circuit 724. As shown in FIG. 7D, processing circuit 724 includes a comparator 750. Comparator 750 can be coupled with a memory 760 which is also coupled with a counter 762. In some examples, memory 760 and counter 762 can be part of pixel cell 700 and processing circuit 724. In some examples, as to be described below, memory 760 and counter 762 can be external to pixel cell 700 and shared among an array of pixel cells 700, to reduce the footprint of pixel cell 700.

Comparator 750, memory 760, and counter 762 can perform a quantization process of the sampled voltage at sampling capacitor 706 (labelled "$V_S$"). Specifically, memory 760 can be a latch memory. Counter 762 can update its output count value (labelled "cnt") periodically based on a clock signal. Comparator 750 can compare an input voltage (labelled "$V_{COMP\_IN}$"), which is derived from the sampled voltage at sampling capacitor 706 (labelled "$V_S$"), with a ramping threshold voltage (labelled "VREF") to generate a decision (labelled "$V_{OUT}$"). The decision can be a latch signal to control the latch memory to store a count value output by counter 762. When ramping VREF voltage reaches or exceeds $V_{COMP\_IN}$, the decision output of comparator 750 trips, and the count value output by counter 762 when the decision trips can be stored in memory 760. The count value stored in memory 760 can represent a quantization result of $V_{COMP\_IN}$ and of $V_S$, which can represent a measurement of the incident light intensity within the global shutter period of FIG. 7C.

As shown in FIG. 7D, pixel cell 700 further includes an AC capacitor 746 and a comparator reset switch 752, which can be operated to compensate for measurement errors (e.g., comparator offset) introduced by comparator 750, as well as other error signals such as, for example, reset noise introduced to charge sensing device 718 (by assertion of the RST signal) which can be present in the $V_S$ sampled voltage. AC capacitor 746 can be implemented as a metal capacitor between first semiconductor die 702 and second semiconductor die 704. AC capacitor 746 can be used to perform two sampling operations within the sampling period. A first sampling operation can be performed prior to transfer of charge from photodiode 716 to charge sensing device 718, which stores reset noise charge. As part of the first sampling operation, comparator reset switch 752 can be enabled (by assertion of the COMP_RST signal) which can short the negative input and output terminals of the comparator. As a result of the first sampling operation, AC capacitor 746 can store a voltage (labelled "$V_{CC}$") across the capacitor which includes a component of the reset noise and an offset voltage of comparator 750. A second sampling operation can then be performed, in which comparator reset switch 752 can be disabled, followed by enabling charge transfer switch 742 to transfer the charge from photodiode 716 to charge sensing device 718. The $V_{COMP\_IN}$ input voltage can include the latest $V_S$ sampled voltage (which represents the charge stored in photodiode 716 and transferred to charge sensing device 718) and the $V_{CC}$ voltage. The reset noise charge component in the latest $V_S$ sampled voltage can be cancelled by the reset noise charge component of the $V_{CC}$ voltage, while the comparator offset component in the $V_{CC}$ voltage remains in the $V_{COMP\_IN}$ input voltage. The comparator offset component in the $V_{COMP\_IN}$ input voltage can cancel out or substantially reduce the effect of the comparator offset of comparator 750 when comparator 750 compares the new $V_{COMP\_IN}$ input voltage with the ramping threshold voltage. As both the comparator offset and reset noise are eliminated or at least substantially reduced, the accuracy of quantization can be improved.

FIG. 7D illustrates an example sequence of control signals for the sample-and-hold operation including COMP_RST. The timings of AB, RST, TG, and SAMPLE signals in FIG. 7C is identical to those in FIG. 7C and their descriptions are not repeated here. As shown in FIG. 7D, within the sampling period and between times T1 and T2, charge transfer from photodiode 716 to charge sensing device 718 has not started. The voltage at charge sensing device 718 (and the sampled voltage $V_S$) can be at a reset voltage $V_{S\_rst}$ and can also include a reset noise component $V\sigma_{KTC}$. Between times T1 and T2, the sampled voltage $V_S$ can be as follows:

$$V_S(T2) = V_{S\_rst} + V\sigma_{KTC} \quad \text{(Equation 1)}$$

Moreover, with comparator reset switch 752 enabled, and the positive terminal of comparator 750 connected to a VREF voltage, the voltage of COMP_IN ($V_{COMP\_IN}$) can track the VREF voltage, but differ by the comparator offset $V_{comp\_offset}$ as follows:

$$V_{COMP\_IN}(T2) = V_{REF} + V_{comp\_offset} \quad \text{(Equation 2)}$$

At time T2, the voltage difference $V_{CC}$ between the right plate of AC capacitor 746 (connected with COMP_IN) and the left plate of AC capacitor 746 (connected with sampling capacitor 706) can be as follows:

$$V_{CC}(T2) = V_{COMP\_IN}(T2) - V_S(T2) \quad \text{(Equation 3)}$$

Combining Equations 1, 2, and 3, the voltage difference $V_{CC}$ at time T2 can be as follows:

$$V_{CC}(T2) = (V_{REF} + V_{comp\_offset}) - (V_{S\_rst} V\sigma_{KTC}) \quad \text{(Equation 4)}$$

The voltage difference $V_{CC}(T2)$ can represent a result of the first sampling operation.

Between T2 and T3, charge transfer switch 734 is enabled, and charge is transferred from photodiode 716 to charge sensing device 718 to develop a new voltage. At time T3, the sampled voltage $V_S(T3)$ can include a new voltage $V_{S\_out}$ corresponding to the transferred charge can be sampled by sampling capacitor 706, as well as the reset noise component $V\sigma_{KTC}$ which remains at charge sensing device 718, as follows:

$$V_S(T3) = V_{S\_out} + V\sigma_{KTC} \quad \text{(Equation 5)}$$

$V_S(T3)$ can represent a result of the second sampling operation.

At time T3, the comparator reset switch 752 is disabled. The voltage difference $V_{CC}$ across AC capacitor 746 remains the same as at time T2. Via AC-coupling, the voltage of the right plate of AC capacitor 746 ($V_{COMP\_IN}$) at time T3 can track $V_S(T3)$ but differ by the voltage difference $V_{CC}$ as follows:

$$V_{COMP\_IN}(T3) = V_S(T3) + V_{CC}(T2) \quad \text{(Equation 6)}$$

Combining Equation 6 with Equation 4 becomes:

$$V_{COMP\_IN}(T3) = V_{S\_out} + V\sigma_{KTC}(V_{REF}V_{comp\_offset}) - (V_{S\_rst}V\sigma_{KTC})$$ (Equation 7)

As shown in Equation 7, the $V\sigma_{KTC}$ component of $V_S(T3)$ and the $V\sigma_{KTC}$ component of $V_{CC}(T2)$ (and $V_{CC}(T3)$) can be cancelled out. Equation 7 can be simplified as follows:

$$V_{COMP\_IN}(T3) = V_{S\_out} - V_{S\_rst} + V_{REF} + V_{comp\_offset}$$ (Equation 8)

After T3, the voltage at $V_{COMP\_IN}$ can be held at $V_{COMP\_IN}(T3)$ when no additional charge is transferred to charge sensing device 718 and/or after sampling switch 740 is disabled.

As shown in Equation 8, $V_{COMP\_IN}(T3)$ includes a difference component $V_{S\_out} - V_{S\_rst}$, which represents the quantity of charge from the photodiode and transferred to charge sensing device 718 between times T2 and T3. $V_{COMP\_IN}(T3)$ further includes the $V_{comp\_offset}$ component as well as $V_{REF}$ (from $V_{CC}$). When comparator 470 compares $V_{COMP\_IN}$ with $V_{REF}$, the comparator offset introduced by comparator 470 can be cancelled by the $V_{comp\_offset}$ component, and only the difference $V_{S\_out} - V_{S\_rst}$, which represents the quantity of charge from the photodiode, is compared against $V_{REF}$ as part of the quantization process to generate the quantization result. Such arrangements can remove the reset noise and comparator offset from the quantization result and improve the accuracy of light intensity measurement.

Figure 8A:
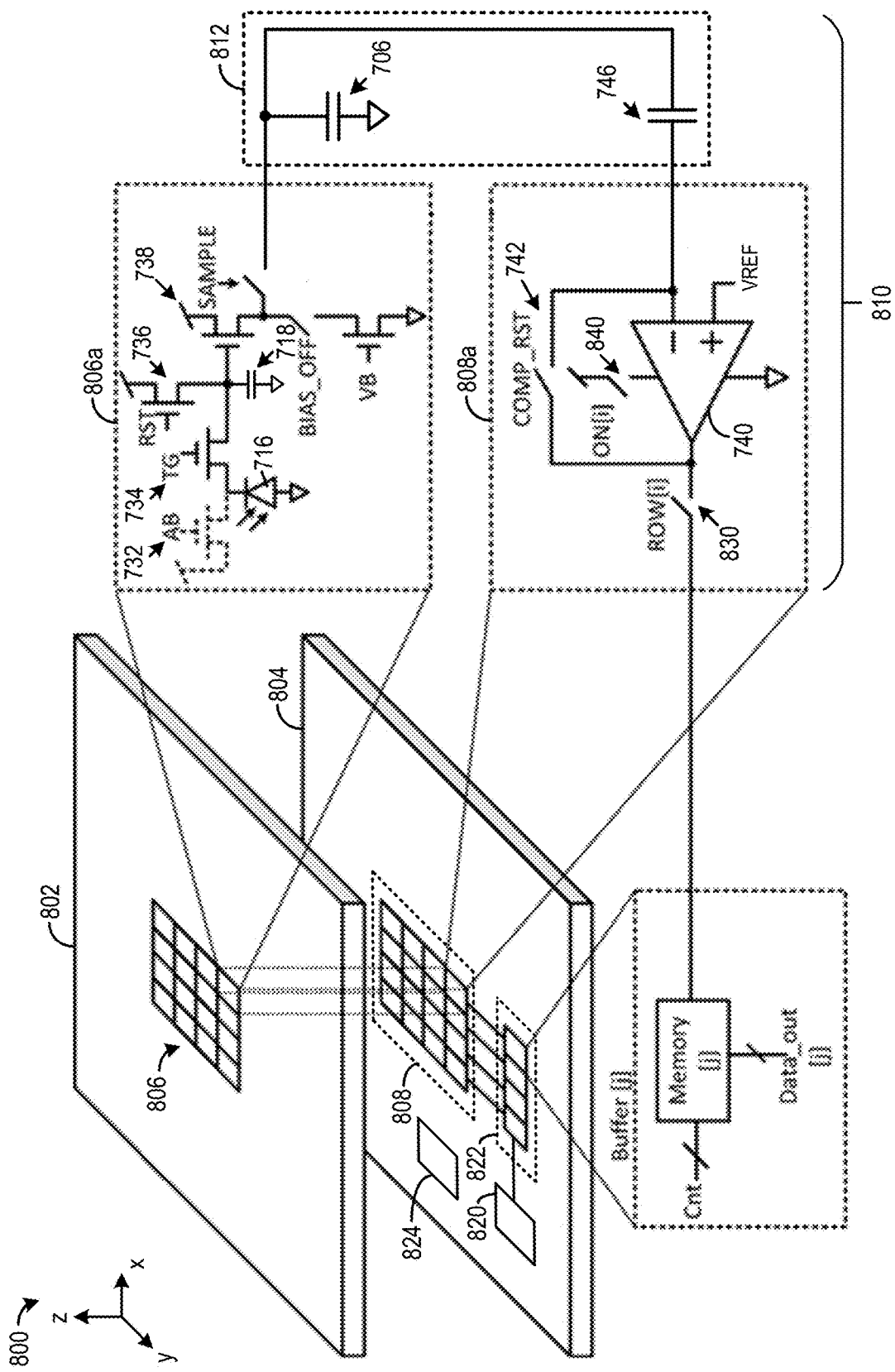
FIG. 8A, FIG. 8B, FIG. 8C, FIG. 8D, and FIG. 8E illustrate an example of an image sensor and their operations.

As described above, to further reduce the footprint of pixel cell 700, memory 760 and counter 762 can be positioned external to pixel cell 700 and can be shared among a set of pixel cells 700. FIG. 8A illustrates an example image sensor 800 which includes shared counter and memories. As shown in FIG. 8A, image sensor 800 includes a first semiconductor die 802 and a second semiconductor die 804. Semiconductor die 802 includes an array of light sensing circuits 806, including light sensing circuits 806a, with each light sensing circuit 806 including photodiode 716, charge sensing device 718, shutter switch 732, transfer switch 734, storage reset switch 736, voltage buffer 738, and sampling switch 740. Semiconductor die 804 includes an array of interface circuits 808, including interface circuits 808a. Each interface circuit 808 includes comparator 750 and comparator reset switch 752 and corresponds to each light sensing circuit 806. Image sensor 800 further includes an array of sampling capacitors 706 and an array of AC capacitors 746. Each sampling capacitor 706 and AC capacitor 746 is coupled between a corresponding pair of light sensing circuit 806 and interface circuit 808 to form a pixel cell 810. The arrays of sampling capacitors 706 and AC capacitors 746 can be formed in a metal layer 812 stacked between first semiconductor die 802 and second semiconductor die 804. The light sensing operations of light sensing circuits 806 and interface circuits 808 using sampling capacitors 706 and AC capacitors 746 are similar to the operations described in FIGS. 7B-7E and are not repeated here.

In addition, image sensor 800 includes a counter 820, a bank of memory buffers 822, and a controller 824, some or all of which can be part of interface circuits 808. Each memory buffer 822 within the bank can be a latch memory similar to memory 760. Counter 820 can update a count value ("cnt") periodically based on a clock. Counter 820 can output the count value to bank of memory buffers 822. Pixel cells 810 can control the timing of when the count values are stored in bank of memory buffers 822 based on comparing the sampled voltages stored at the pixel cells against a ramping threshold to quantize the sampled voltages, as described above. Controller 824 can control the access to bank of memory buffers 822 among pixel cells 810 to quantize the sampled voltages. In FIG. 8A, controller 824 can allow one row of pixel cells 810 (e.g., a set of pixel cells aligned along the x-axis of FIG. 8A) to access bank of memory buffers 822 to quantize the sampled voltages at the row of pixel cells 810, followed by another row. Within a column of pixel cells 810 (e.g., a set of pixel cells aligned along the y-axis of FIG. 8A), comparator 750 of each pixel cell can be selectively coupled with a memory buffer within the bank via a row switch 830. Comparator 750 of each pixel cell is also selectively coupled with a power supply via a power switch 832.

Figure 8B:
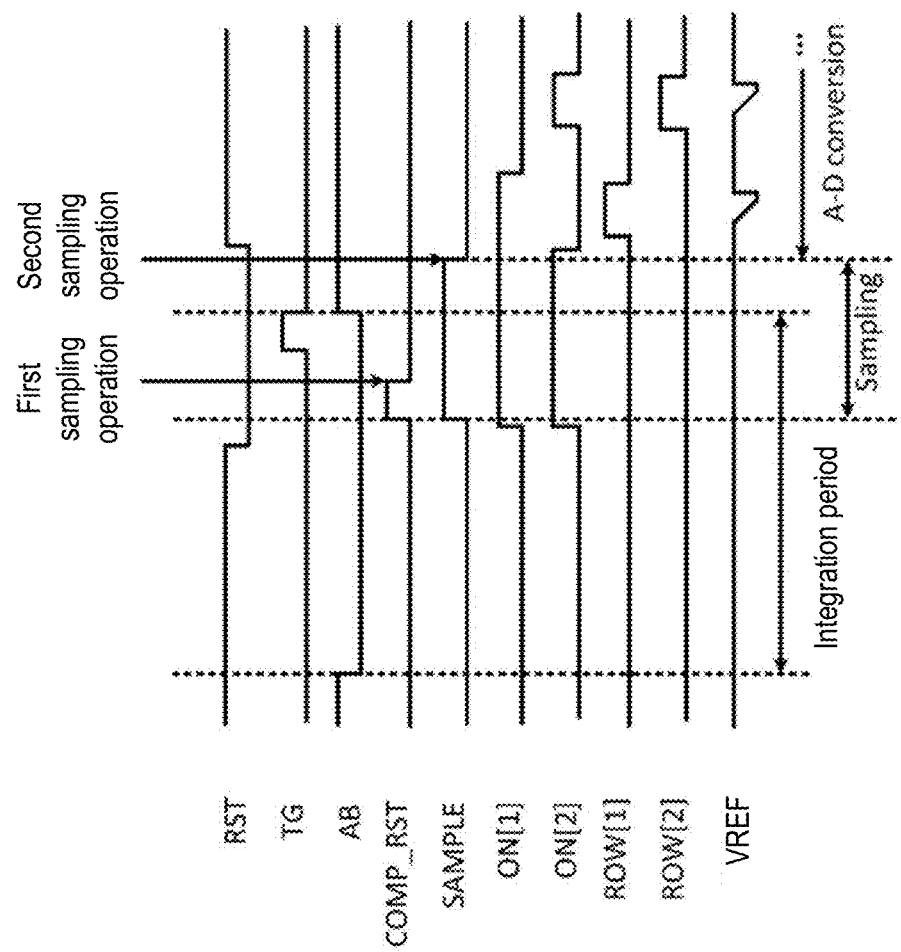
Figure 8C:
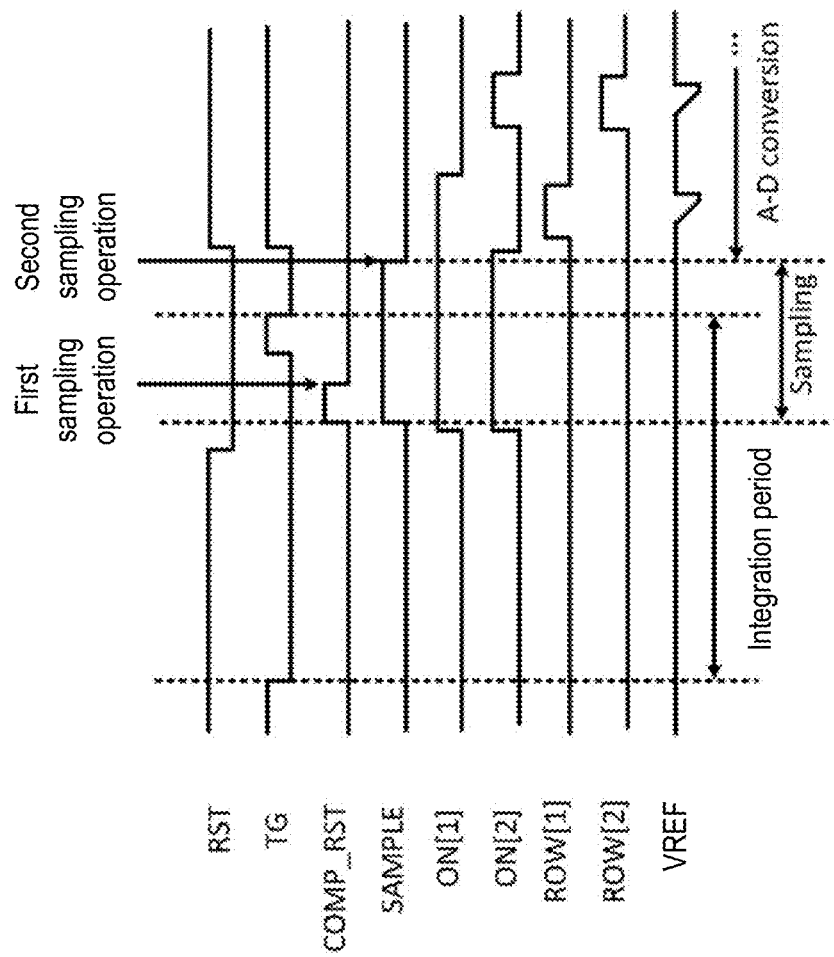

FIG. 8B and FIG. 8C illustrate example sequences of control signals for image sensor 800. The sequence of control signals for FIG. 8B can be, for an example, of pixel cell 810 that includes shutter switch 732, whereas the sequence of control signals for FIG. 8C can be, for an example, of pixel cell 810 that does not include shutter switch 732. In FIG. 8B and FIG. 8C, the RST, TG, AB, and COMP_RST can be global signals to each pixel cell to perform a global shutter operation in a global integration period, as well as a first sampling operation (to sample reset noise charge and comparator offset) and a second sampling operation (to sample charge accumulated in the global integration period) in a sampling period. Following the sampling period, rows of pixel cells 810 can take turn to access bank of memory buffers 822 to perform quantization. For example, when a first row of pixel cells 810 is selected to access bank of memory buffers 822, row switch 830 of each pixel cell within the row (labelled "ROW[1]") is enabled to couple the output of comparator 750 to memory buffer 822, whereas power switch 832 of each pixel cell within that row (labelled "ON[1]") is enabled by controller 824 to enable comparator 750. Comparator 750 of each pixel cell can compare the sampled voltage stored at the pixel cell against ramping threshold VREF to generate a decision, which can be transmitted via row switch 830 to control a time when memory buffer 822 stores the count value from counter 820. The count values stored in bank of memory buffers 822 can represent the quantization results for first row of pixel cells 810. The count values in bank of memory buffers 822 can be read out (e.g., by an image reconstruction engine) via data_out buses. After the count values are read out from the bank of memory buffers for the first row of pixel cells 810, row switches 830 and power switches 832 of the first row of pixel cells 810 (ROW[1] and ON[1]) can be disabled by controller 824. Controller 824 can then select a second row of pixel cells 810 to access bank of memory buffers 822 to quantize the sampled voltages stored at the second row of pixel cells 810. Row switch 830 and power switch 832 of the second row of pixel cells (ROW[2] and ON[2]) can be enabled by controller 824 to perform the quantization.

Figure 8D:
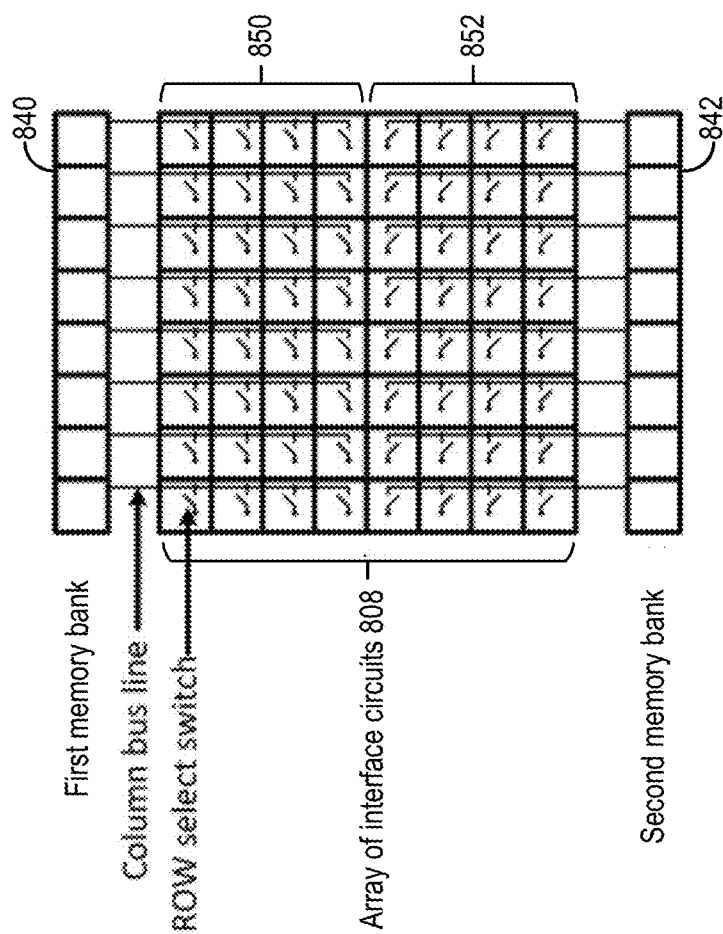
Figure 8E:
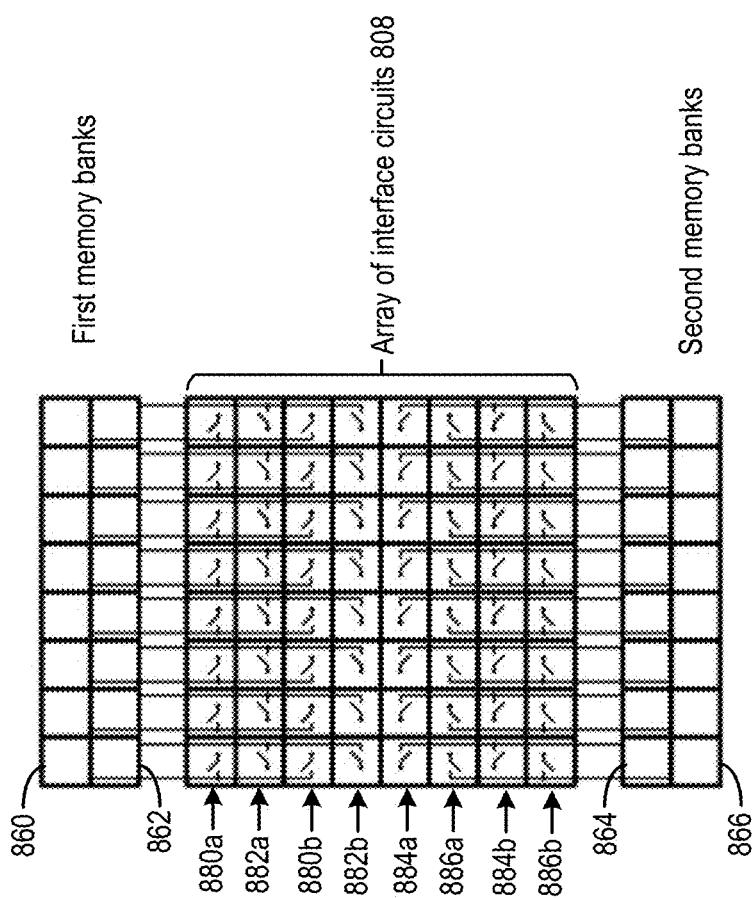

Although FIG. 8A illustrates that a single bank of memory buffers 822 is shared among rows of pixel cells 810, it is understood that multiple banks of memory buffers can be provided, which can increase the number of pixel cells that can concurrently perform quantization with counter 820 and with the memory buffers, and the speeds of read out and image generation can be increased. For example, as shown in FIG. 8D, two memory banks 840 and 842 can be provided. First memory bank 840 can be shared among rows 850 of pixel cells 810, whereas bottom memory bank 842 can be shared among rows 852 of pixel cells 810. Moreover, as shown in FIG. 8E, four memory banks 860, 862, 864, and 866 can be provided. Memory bank 870 can be shared among rows 880a and 880b of pixel cells 810, memory bank 872 can be shared among rows 882a and 882b of pixel cells 810, memory bank 874 can be shared among rows 884a and 884b of pixel cells 810, whereas memory bank 876 can be shared among rows 886a and 886b of pixel cells 810.

The arrangements in FIG. 8A-FIG. 8E, by putting the memory external to the pixel cell, can further the footprint of the pixel cells, which allows packing a large number of pixel cells in an image sensor to improve resolution while minimizing the footprint of the image sensor. Moreover, the reliability and speed of image generation can also be improved. For example, as the memory is positioned outside the pixel cell and does not affect the footprint of the pixel cell, redundant memory devices can be provided to store the digital outputs from each pixel cell to reduce the likelihood of losing the digital outputs (and the pixel values) due to defective memory. But since the memory comprises mostly digital circuit and typically has a very small footprint, adding redundant memory (to be shared by the pixel cells) typically do not significantly increase the footprint of the image sensor. Moreover, compared with an implementation where the pixel cell transmits an analog voltage (e.g., a voltage at the charge sensing device) to an external ADC to perform the quantization operation, the disclosed techniques allow a part of the quantization (the comparator comparison) operation to be performed within the pixel cell, and only a digital output (the decision of the comparator) is transmitted from the pixel cell to the external memory. Compared with an analog voltage, the digital output can be transmitted with high fidelity (to distinguish between zeroes and ones) and at high speed. All these can improve the reliability and speed of image generation based on the light sensing operations by the pixel cells.

FIG. 9 includes a flowchart that illustrates an example method 900 for performing measurement of light intensity. Method 900 can be performed by, for example, pixel cell 700 of FIG. 7A-FIG. 7E and image sensor 800 of FIG. 8A-FIG. 8D based on the techniques described above.

In step 902, an interface circuit (e.g., interface circuits 720, interface circuit 808) can enable a photodiode of a light sensing circuit (e.g., light sensing circuit 806) to accumulate charge responsive to incident light within a integration period. The light sensing circuit can be in a first semiconductor die (e.g., first semiconductor dies 702, 802, etc.), whereas the interface circuit can be in a second semiconductor die (e.g., second semiconductor dies 704, 804, etc.). The first semiconductor die and the second semiconductor die may form a stack, as shown in FIG. 7A and FIG. 8A. The light sensing circuit in the first semiconductor die can be configured as a front-side illumination device or a back-side illumination device as shown in FIG. 6A and FIG. 6B. The enabling can be based on, for example, disabling shutter switch 732 to enable the photodiode to accumulate charge.

In step 904, the interface circuit can transfer the charge from the photodiode to a charge sensing device (e.g., charge sensing device 718) of the light sensing circuit. The transfer can be performed via transfer switch 734 under the control of the interface circuit. The charge sensing device can be, for example, a floating drain device, a metal capacitor, a polysilicon capacitor, etc.

In step 906, the interface circuit can perform, using a sampling capacitor (e.g., sampling capacitor 706), a sample-and-hold operation to convert the charge stored in the charge sensing device into a voltage. Specifically, the sampling capacitor can be coupled with the charge sensing device via a sampling switch controlled by the interface circuit. Referring back to FIG. 7C, within a sampling period, the transfer switch can be enabled, as part of step 904, to transfer the charge from the photodiode to the charge sensing device to develop a voltage, while the sampling switch is also enabled to enable the sampling capacitor to track the voltage of the charge sensing device. The transfer switch can be disabled prior to the end of the sampling period to freeze the voltage at the charge sensing device, and the sampling capacitor to continue tracking the voltage at the charge sensing device until the sampling period ends. After the sampling period ends, the sampling switch can be disabled, and the sampling capacitor can hold the sampled voltage for a subsequent quantization process.

In some examples, the interface circuit can include a resettable comparator (e.g., comparator 750) and an AC capacitor (e.g., AC capacitor 746). Referring back to FIG. 7E, as part of step 906, the comparator can be reset within the sampling period to store comparator offset and reset noise (which is also present in the charge sensing device and reflected in the sampled voltage at the sampling capacitor) in the AC capacitor. The AC capacitor can also track the voltage sampled and held by the sampling capacitor and combine the sampled voltage with the reset noise and comparator offset information to generate an output voltage (e.g., $V_{COMP\_IN}$).

In step 908, the interface circuit can generate a digital output based on the voltage sample and held at the sampling capacitor to represent an intensity of the incident light received by the photodiode. The digital output can be generated based on a quantization process, in which the comparator can compare the output voltage of the AC capacitor with a ramping threshold to generate a decision. The decision can control a memory (e.g., memory 760, 822, etc.) to store a digital value generated from a counter (e.g., counter 762, 820, etc.). The memory and the counter can be shared by multiple pixel cells, as described in FIG. 8A to FIG. 8E, such that groups of pixel cells can take turn in storing the digital values at the shared memory.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
   a first semiconductor die, the first semiconductor die including a photodiode and a charge storage device;
   a sampling capacitor;
   an AC capacitor coupled with the sampling capacitor;
   a second semiconductor die forming a stack with the first semiconductor die, the second semiconductor die including an interface circuit coupled with the photodiode, the charge sensing storage device, the sampling capacitor, and the AC capacitor, the interface circuit being configured to:
      enable the photodiode to accumulate charge responsive to incident light within a integration period;
      transfer the charge from the photodiode to the charge storage device within the integration period;
      perform, using the sampling capacitor, a sample-and-hold operation to convert the charge in the charge storage device into a first voltage;
      store a second voltage at the AC capacitor based on the first voltage; and
      generate a digital output based on the second voltage to represent an intensity of the incident light received by the photodiode.

2. The apparatus of claim 1, further comprising a sampling switch coupled between the charge storage device and the sampling capacitor;
   wherein the interface circuit is configured to, as part of the sample-and-hold operation:
      enable the sampling switch to cause the sampling capacitor to sample the charge accumulated in the charge storage device to develop the first voltage; and
      disable the sampling switch to cause the sampling capacitor to hold the first voltage.

3. The apparatus of claim 2,
   further includes further comprising a voltage buffer coupled between the charge storage device and the sampling capacitor and configured to buffer the first voltage;
   wherein the sampling capacitor is operated to sample the buffered first voltage received from the voltage buffer when the sampling switch is enabled, and to hold the buffered first voltage after the sampling switch is disabled.

4. The apparatus of claim 3, wherein the sampling switch and the voltage buffer are included in the first semiconductor die.

5. The apparatus of claim 4, wherein the sampling capacitor includes at least one of:
   a metal capacitor or a semiconductor capacitor sandwiched between the first semiconductor die and the second semiconductor die in the stack, or
   a metal capacitor or a semiconductor capacitor formed in the second semiconductor die.

6. The apparatus of claim 4, wherein:
   the interface circuit further comprises a resettable comparator;
   the AC capacitor is coupled between the sampling capacitor and the comparator;
   the interface circuit is configured to, when the sampling switch is enabled:
      control the comparator to enter a reset state;
      operate the AC capacitor to:
         obtain a first sample of a reset voltage of the charge storage device caused by a prior reset operation of the charge storage device;
         obtain a second sample of an offset of the comparator when the comparator is in the reset state;
         store a third voltage across the AC capacitor based on the first sample of the reset voltage and the second sample of the offset; and
         output the second voltage to the comparator based on the first voltage and the third voltage.

7. The apparatus of claim 6, further comprising a transfer switch coupled between the photodiode and the charge storage device;
   wherein the interface circuit is configured to, within the integration period:
      control the comparator to exit the reset state to hold the third voltage across the AC capacitor;
      enable the transfer switch to transfer the charge from the photodiode to the charge storage device; and
      disable the transfer switch to stop the transfer of the charge such that the charge storage device outputs the first voltage.

8. The apparatus of claim 7, wherein:
   an output of the comparator is coupled with a memory;
   the memory is coupled with a counter configured to update a count value periodically based on a clock;
   the comparator is configured to, after exiting the reset state, compare the second voltage against a ramping threshold to output a decision;
   the memory is configured to store the count value from the counter based on the decision; and
   the stored count value represents the digital output.

9. The apparatus of claim 8, further comprising a selection switch coupled between the output of the comparator and the memory; and
   wherein the interface circuit is configured to:
      enable the selection switch to transmit the decision to the memory when the apparatus is selected to store the digital output in the memory; and
      disable the selection switch to block the decision from the memory when the apparatus is not selected to store the digital output in the memory.

10. The apparatus of claim 8, wherein the memory and the counter are included in the second semiconductor die.

11. The apparatus of claim 1, further comprising a shutter switch coupled between the photodiode and a charge sink, wherein the interface circuit is configured to:
  disable the shutter switch to start the integration period and to enable the photodiode to accumulate the charge; and
  enable the shutter switch to end the integration period and to prevent the photodiode from accumulating the charge.

12. The apparatus of claim 1, wherein the charge storage device comprises at least one of: a floating drain node, or a pinned storage node.

13. The apparatus of claim 1, wherein the interface circuit is configured to start the sample-and-hold operation within the integration period.

14. The apparatus of claim 1, wherein the interface circuit is coupled with a memory;
  wherein the interface circuit is configured to generate the digital output and store the digital output in the memory after a read out operation of the memory completes.

15. An image sensor comprising:
  a first semiconductor die, the first semiconductor die including an array of light sensing circuits, each light sensing circuit of the array of light sensing circuits comprising a photodiode and a charge storage device;
  an array of sampling capacitors, each sampling capacitor of the array of sampling capacitors corresponding to a light sensing circuit of the array of light sensing circuits;
  one or more AC capacitors coupled with the array of sampling capacitors;
  a second semiconductor die forming a stack with the first semiconductor die, the second semiconductor die including an array of interface circuits, each interface circuit of the array of interface circuits, each light sensing circuit of the array of light sensing circuits, and each sampling capacitor of the array of sampling capacitors forming a pixel cell, the interface circuit of each pixel cell being configured to:
    enable the photodiode of the light sensing circuit to accumulate charge responsive to incident light within a global integration period;
    transfer the charge from the photodiode to the charge storage device of the corresponding light sensing circuit within the global integration period;
    perform, using the sampling capacitor of the pixel cell, a sample-and-hold operation on the charge stored in the charge storage device to obtain a first voltage;
    store a second voltage at a AC capacitor of the one or more AC capacitors based on the first voltage; and
    generate a digital output based on the second voltage to represent an intensity of the incident light received by the pixel cell.

16. The image sensor of claim 15, wherein in each pixel cell:
  the light sensing circuit further includes a sampling switch coupled between the charge storage device and the sampling capacitor; and
  the interface circuit is configured to, as part of the sample-and-hold operation:
    enable the sampling switch to cause the sampling capacitor to sample the charge stored in the charge storage device to develop the first voltage; and
    disable the sampling switch to cause the sampling capacitor to hold the first voltage.

17. The image sensor of claim 16, wherein in each pixel cell:
  the light sensing circuit further includes a voltage buffer coupled between the charge storage device and the sampling capacitor and configured to buffer the first voltage; and
  the sampling capacitor is operated to sample the buffered first voltage received from the voltage buffer when the sampling switch is enabled, and to hold the buffered first voltage after the sampling switch is disabled.

18. The image sensor of claim 17, further comprising one or more resettable comparators;
  an AC capacitor of the one or more AC capacitors is coupled between the sampling capacitor of and the comparator;
  the interface circuit of each pixel cell is configured to, when the sampling switch is enabled:
    control a comparator of the one or more comparators to enter a reset state;
    operate the AC capacitor to:
      obtain a first sample of a reset voltage of the charge storage device of the pixel cell caused by a prior reset operation of the charge storage device;
      obtain a second sample of an offset of the comparator when the comparator is in the reset state;
      store a third voltage across the AC capacitor based on the first sample of the reset voltage and the second sample of the offset; and
      output the second voltage to the comparator based on the first voltage and the third voltage.

19. The image sensor of claim 18, wherein each light sensing circuit further comprises a transfer switch coupled between the photodiode and the charge storage device;
  wherein the interface circuit of each pixel cell is configured to, within the global integration period:
    control the comparator to exit the reset state to hold the third voltage across the AC capacitor;
    enable the transfer switch of the pixel cell to transfer the charge from the photodiode to the charge storage device; and
    disable the transfer switch to stop the transfer of the charge such that the charge storage device outputs the first voltage.

20. The image sensor of claim 19, further comprising a controller, a counter, and a bank of memory buffers;
  wherein:
    each memory buffer of the bank of memory buffers is coupled with the counter;
    the counter is configured to update a count value periodically based on a clock;
    an output of the comparator of the one or more comparators is coupled to each memory buffer via a selection switch controlled by the controller;
    the comparator is configured to, after exiting the reset state, compare the second voltage against a ramping threshold to generate a decision;
    the controller configured to, at different times, enable the selection switches of subsets of the pixel cells to transmit the decisions of the comparators of the selected subsets of the pixel cells to the bank of memory buffers, after read-out operations of the bank of memory buffers complete;
    the bank of memory buffers is configured to store the count values from the counter based on the decisions of the selected subsets of the pixel cells at the different times; and the stored count values represent the digital outputs of the pixel cells.

* * * * *